(12) United States Patent
Lee et al.

(10) Patent No.: US 7,385,237 B2
(45) Date of Patent: Jun. 10, 2008

(54) FIN FIELD EFFECT TRANSISTORS WITH LOW RESISTANCE CONTACT STRUCTURES

(75) Inventors: Deok-Hyung Lee, Gyeonggi-do (KR); In-Deog Bae, Seoul (KR); Byeong-Chan Lee, Gyeonggi-do (KR); Jong-Wook Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 345 days.

(21) Appl. No.: 11/076,185

(22) Filed: Mar. 9, 2005

(65) Prior Publication Data

US 2005/0199920 A1 Sep. 15, 2005

(30) Foreign Application Priority Data

Mar. 11, 2004 (KR) .................... 10-2004-0016384

(51) Int. Cl.
*H01L 29/08* (2006.01)
(52) U.S. Cl. .................. 257/288; 257/213; 257/E29.04
(58) Field of Classification Search ................ 257/213, 257/288, E29.04
See application file for complete search history.

(56) References Cited

U.S. PATENT DOCUMENTS

| 6,413,802 | B1 | 7/2002 | Hu et al. ................ 438/151 |
| 6,525,403 | B2 * | 2/2003 | Inaba et al. ............... 257/618 |
| 6,867,433 | B2 * | 3/2005 | Yeo et al. .................. 257/67 |
| 7,005,330 | B2 * | 2/2006 | Yeo et al. ................... 438/157 |
| 7,005,700 | B2 * | 2/2006 | Lee .......................... 257/316 |
| 7,148,541 | B2 * | 12/2006 | Park et al. ................. 257/347 |
| 7,172,943 | B2 * | 2/2007 | Yeo et al. .................. 438/300 |
| 7,173,305 | B2 * | 2/2007 | Yang et al. ................ 257/326 |
| 7,173,943 | B1 * | 2/2007 | Borchew et al. ........... 370/474 |
| 7,180,134 | B2 * | 2/2007 | Yang et al. ................ 257/347 |
| 7,301,206 | B2 * | 11/2007 | Yeo et al. .................. 257/369 |
| 2005/0104096 | A1 * | 5/2005 | Lee et al. ................... 257/288 |

FOREIGN PATENT DOCUMENTS

KR   10-2003-0065631   8/2003

OTHER PUBLICATIONS

Wolf, Stanley. "Silicon Processing for the VLSI Era, vol. 2, Process Integration." Sunset Beach, CA: Lattic Press. 1990, pp. 126, 144-146.*

(Continued)

*Primary Examiner*—Evan Pert
*Assistant Examiner*—Victor A. Mandala, Jr.
(74) *Attorney, Agent, or Firm*—Myers Bigel Sibley & Sajovec

(57) ABSTRACT

Fin FET semiconductor devices are provided which include a substrate, an active pattern that protrudes vertically from the substrate and that extends laterally in a first direction, a device isolation layer which has a top surface that is lower than a top surface of the active pattern, a gate structure on the substrate that extends laterally in a second direction to cover a portion of the active pattern and a conductive layer that is on at least portions of side surfaces of the active pattern that are adjacent a side portion of the gate structure. The conductive layer may comprise a semiconductor layer, and the semiconductor layer may be in electrical contact with a contact pad. In other embodiments, the conductive layer may comprise a contact pad.

25 Claims, 16 Drawing Sheets

OTHER PUBLICATIONS

Kedzierski, et al. "Extension and Source/Drain Design for High-Performance FinFET Devices," *IEEE Transactions on Electron Devices*, vol. 50, No. 4, Apr. 2003.

Lindert et al., "Quasi-Planar FinFETs with Selectively Grown Germanium Raised Source/Drain," *IEEE International SOI Conference*, Oct. 2001.

* cited by examiner

FIN FIELD EFFECT TRANSISTORS WITH LOW RESISTANCE CONTACT STRUCTURES

CROSS-REFERENCES TO RELATED APPLICATIONS

This application claims priority under 35 U.S.C. § 119 from Korean Patent Application No. 2004-16384, filed on Mar. 11, 2004, the disclosure of which is incorporated herein by reference as if set forth in its entirety.

FIELD OF THE INVENTION

The present invention relates to semiconductor devices and, more particularly to, fin field effect transistors ("FET") and method of manufacturing such transistors.

BACKGROUND OF THE INVENTION

Complementary metal oxide silicon ("CMOS") devices are widely used in various logic circuit applications such as central processing units and memory devices. In many semiconductor device applications, it is important that the semiconductor device exhibit low power consumption, small size and/or high operation speeds. CMOS devices are often capable of meeting all of these requirements. However, as the size of CMOS devices are reduced to very small levels, an effect known as the short channel effect may result as a consequence of the scaling-down of the gate size of the device. This short-channel effect can degrade the performance of the CMOS device.

Conventional CMOS devices are typically fabricated on bulk silicon substrates. However, in such conventional CMOS devices, the characteristics of the device may be strongly influenced by the processing conditions used in fabricating the device when the gate length of the device is scaled down to less than about 50 nm, and conventional CMOS devices may break down completely and cease to operate as semiconductor circuits when the gate length of the device is scaled down to less than about 30 nm. By way of example, certain 30 nm CMOS devices manufactured by Intel Co., Ltd. may exhibit poor current-voltage curve characteristics (I-V characteristics) when compared with conventional CMOS devices.

The use of silicon-on-insulator ("SOI") semiconductor devices ("SOI devices") has been suggested as a way of providing CMOS devices with channel lengths of about 30 nm or less that have good I-V characteristics. However, it has been found that fabricating conventional CMOS devices on SOI substrates may result in an increase in the parasitic resistance at the source/drain regions because the silicon layer of the SOI substrate is very thin. As such, a selective epitaxial growth step at the source/drain regions may be included when fabricating transistors in SOI devices. In addition, SOI devices may exhibit relatively poor contact with the substrate such that a floating body effect may arise and/or heat conduction between the device and the substrate may be reduced. All of these effects may act to reduce the performance of the device.

The use of double gate structures (i.e., providing a gate at each side of a channel through which electric current passes) has also been suggested as a way for efficiently reducing the channel length of CMOS devices to less than about 25 nm. Such CMOS devices are known as fin field effect transistors ("fin FET"). Fin FET transistors may provide improved gate control characteristics, which may result in reduced leakage current between the source and drain when compared with a conventional, single gate CMOS device, thereby improving the drain-induced barrier lowering (DIBL) phenomenon. In addition, the threshold voltage of a fin FET device may be varied dynamically because of the double gate. As such, the switching characteristic of the channel in the transistor may be improved as compared to conventional single gate CMOS devices. Accordingly, the driving current of the transistor may be increased and the short channel effect may be reduced or prevented.

However, one potential disadvantage of fin FET devices is that they may exhibit increased parasitic resistance in the source/drains. This effect may occur because the width of the fin in the fin FET may be on the order of a few nanometers, and thus the pad contact area in which electrical contact is made with the source/drain regions may be significantly smaller than the contact area in conventional CMOS devices. Accordingly, the parasitic resistance may be increased at the pad/n-junction, thereby reducing the driving current of the fin FET.

One way of reducing the parasitic resistance in fin FET transistors that has been suggested is to deposit polycrystalline silicon or silicon germanium (SiGe) on the source/drain regions, as disclosed in the article entitled "Quasi-Planar fin FETs with selectively grown germanium raised source/drain", IEEE International SOI Conference, October 2001, that is incorporated herein by reference. As noted above, the source/drain regions in conventional fin FETs are thin and may exhibit a relatively high electrical resistance; thus the driving current of these devices may be significantly deteriorated as compared to conventional, single gate devices. According to the above-referenced IEEE International SOI Conference article, a germanium layer may be formed on the source/drain regions of the fin FET using a selective epitaxial growth process in order to enlarge the contact surface of the source/drain regions with which a contact pad may make electrical contact. This enlargement of the contact surface may act to reduce the electrical resistance at the source/drain regions.

Another solution to the problem of increased parasitic resistance in the fin FET that has been suggested is covering the entire source/drain region with raised source/drain silicon (RSD Si) to enlarge the contact surface of the source/drain region, as disclosed in the article entitled "Extension and source/drain design for high-performance fin FETs devices", IEEE Transactions on Electron Devices, Vol. 50, No. 4, April 2003, the contents of which are incorporated herein by reference. However, the enlarged contact surface provided by the use of RSD Si may require that the gate be about two times as tall as the height of the source/drain in the fin FET. An over-etching process is also required for removing the spacer formed on the source/drain regions.

SUMMARY OF THE INVENTION

Pursuant to embodiments of the present invention, fin FET devices may be provided that have an enlarged contact surface in the source/drain regions that may facilitate reducing the electrical resistance of the source/drain regions. Methods of manufacturing such fin FET devices may also be provided.

Pursuant to certain embodiments of the present invention, semiconductor devices are provided which include a substrate that has a semiconductor fin extending from a surface thereof. The device further includes an isolation layer on the substrate and on portions of the semiconductor fin adjacent the substrate. Portions of the semiconductor fin extend beyond the isolation layer. A gate structure is provided on the isolation layer and on a portion of the semiconductor fin such that the gate electrode and the semiconductor fin extending in different directions. In addition, a conductive layer is provided on the isolation layer and on side surfaces of the semiconductor fin on opposite sides of the gate electrode.

In some embodiments, the conductive layer may comprise a semiconductor layer, and the semiconductor layer may be in electrical contact with a contact pad. In other embodiments, the conductive layer may comprise a contact pad. The semiconductor device may be a fin field effect transistor. The semiconductor fin may include first and second source/drain regions. In certain embodiments, the first and second source/drain regions may have an n−/n+/contact pad junction structure. The semiconductor device may also include a first hard mask layer that is interposed between the semiconductor fin and the gate structure. The contact pad may be in electrical contact with substantially all of the side surface of a source/drain region.

In the above-discussed semiconductor devices, the gate structure may include a gate insulation layer that is on a portion of the side surfaces of the semiconductor fin, a first gate electrode that extends laterally in the second direction from the gate insulation layer, a second gate electrode that is on a top surface of the first gate electrode and on a top surface of the first hard mask layer, and a second hard mask layer that is on a top surface of the second gate electrode. The semiconductor device may also include a first insulation interlayer on the isolation layer. The top surface of the first insulation interlayer may be substantially coplanar with the top surface of the first hard mask layer. The first insulation interlayer may also be is in direct contact with one or both of the first gate electrode of the gate structure and the semiconductor layer. The top surface of the first insulation interlayer may be substantially coplanar with the top surface of the first gate electrode.

The semiconductor device may also include a gate spacer on the first insulation interlayer and on a side surface of the gate structure. A second insulation interlayer may also be provided on the first insulation interlayer. In certain embodiments, the top surface of the second insulation interlayer is substantially coplanar with the top surface of the gate structure. The gate spacer may be covered by the second insulation interlayer. The contact pad may be on the semiconductor layer and the first hard mask layer. Additionally, a silicide layer may be interposed between the semiconductor layer and the contact pad. Also, in certain embodiments, an etch stop layer may be provided on the top surface of the isolation layer. This etch stop layer may include a vertically extending portion that is adjacent to a source/drain region of the semiconductor device.

Pursuant to further embodiments of the present invention, methods of manufacturing a fin field effect transistor are provided. Pursuant to these methods, a first hard mask pattern is formed on a substrate in a first direction. The substrate is then selectively etched using the first hard mask pattern as an etching mask to form a semiconductor fin that protrudes vertically from the substrate and lies underneath the first hard mask. An isolation layer is then formed on the substrate such that a top surface thereof is lower than a top surface of the semiconductor fin in regions adjacent the semiconductor fin. A gate structure is then formed extending in a second direction that is different than the first direction on the isolation layer. Finally, a semiconductor layer or a contact pad may be formed on a side surface of the semiconductor fin at a side portion of the gate structure. In embodiments of these methods where a semiconductor layer is provided, a contact pad may be provided that is electrically connected to the semiconductor layer.

In certain embodiments of these methods, the isolation layer may be formed by forming an insulation layer on the selectively etched substrate and the first hard mask pattern. The insulation layer may then be planarized to expose the first hard mask pattern. The planarized insulation layer is then partially removed until a top surface of the insulation layer is lower than the top surface of the semiconductor fin. Likewise, the gate structure may be formed, for example, by forming a gate insulation layer on the side surface of the semiconductor fin, and then forming a first gate conductive layer on the isolation layer, the gate insulation layer and the first hard mask pattern. Next, the first gate conductive layer is planarized until the first hard mask pattern is exposed to form a first gate conductive pattern. Then, a second gate conductive layer is formed on the first gate conductive pattern and on the first hard mask pattern, and a second hard mask layer is formed on the second gate conductive layer. Then, the second hard mask layer, the second gate conductive layer and the first gate conductive pattern may be sequentially patterned to form the gate structure.

In certain embodiments of the above-described methods, a first insulation interlayer may be formed on the isolation layer such that a top surface of the first insulation interlayer is substantially coplanar with a top surface of the first hard mask pattern. This first insulation interlayer may be formed by forming an insulation layer on the isolation layer and on the gate structure, then planarizing the insulation layer to expose the gate structure, and then partially removing the insulation layer by an etch-back process until the first hard mask pattern is exposed. The top surface of the first insulation interlayer may be formed to be substantially coplanar with a top surface of a first gate conductive pattern of the gate structure.

Certain embodiments of these methods may also include the step of forming a gate spacer on the first insulation interlayer and on a side surface of the gate structure. The gate spacer may be formed by forming a silicon nitride layer on the first insulation interlayer and on the gate structure and then partially removing the silicon nitride layer by an etch-back process. Additionally, a second insulation interlayer may be formed on the first insulation interlayer such that a top surface of the second insulation interlayer is substantially coplanar with a top surface of the gate structure. The second insulation interlayer may be formed by forming an insulation layer on the first insulation interlayer and on the gate structure and then planarizing the insulation layer to expose the gate structure.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Figure 1:
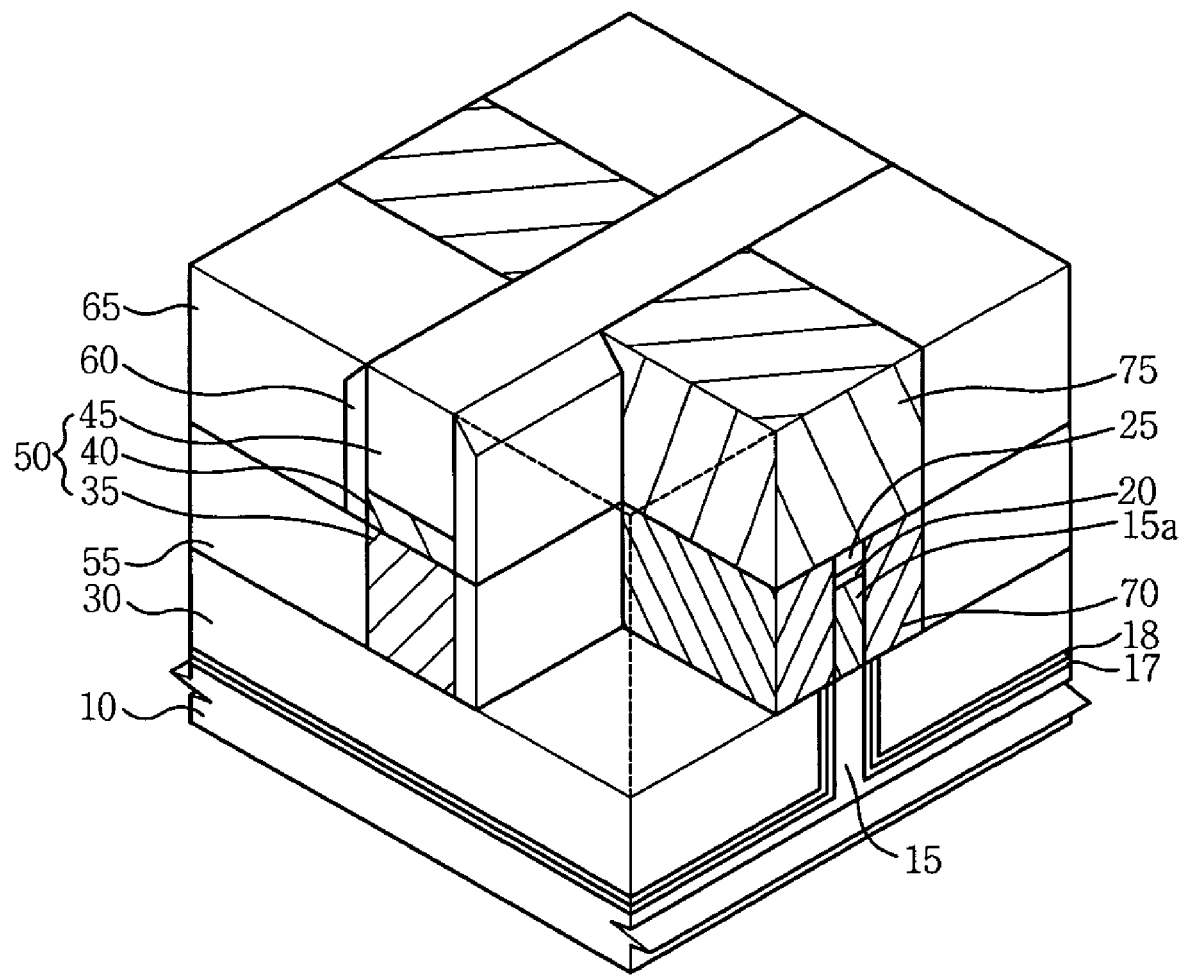
FIG. 1 is a perspective view illustrating a fin FET according to first embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a perspective view illustrating a fin FET according to first embodiments of the present invention. A corner portion of the fin FET is removed to better illustrate the inner structure of the transistor. The outer profile of the removed portion is depicted as a dotted line in FIG. 1.

Referring to FIG. 1, the fin FET of the first embodiment of the present invention includes a substrate 10 such as a silicon substrate, an active pattern 15 that protrudes from the substrate 10, a first hard mask layer 25, a device isolation layer 30, a gate structure 50 comprising a first gate electrode layer 35, a second gate electrode layer 40 and a second hard mask layer 45, source/drain regions formed by implanting ions into the active pattern 15, a first insulation interlayer 55, a gate spacer 60, a second insulation interlayer 65, a semiconductor layer 70 and a contact pad 75. As is also shown in FIG. 1, a sidewall oxide layer 17 and a liner silicon nitride layer 18 may be formed on the top surface of the substrate 10 and/or on side surfaces of the active pattern 15.

The active pattern 15 extends in a first direction on the substrate 10. The first hard mask layer 25 may be formed on a top surface of the active pattern 15, and may act to protect the active pattern 15 and the source/drain regions into which n-type dopants are implanted in subsequent processing steps.

The device isolation layer 30 may be formed on the substrate 10 for isolating devices from each other on the substrate 10. As shown in FIG. 1, the top surface of the device isolation layer 30 may be lower than the top surface of the active pattern. In embodiments of the present invention depicted in FIG. 1, the top of the channel of the fin FET is positioned to correspond to the top surface of the device isolation layer 30. The device isolation layer may comprise, for example, an oxide layer formed by a CVD process including a high-density plasma chemical vapor deposition (HDP CVD) process and/or an SOG-based layer such as, for example, a layer comprising silazane manufactured by Tonnen in Japan, which is widely known as TOSZ.

The gate structure 50 extends in a second direction on the substrate 10. The second direction is different from the first direction in which the active pattern 15 extends. As a result, some portions of the active pattern and the first hard mask layer are covered by portions of the gate structure 50. In the embodiment depicted in FIG. 1, the second direction is substantially perpendicular to the first direction, so that the gate structure 50 crosses the active pattern 15 at a substantially right angle.

The gate structure 50 may include an active pattern that extends in a first direction, a gate insulation layer (not shown) that is formed on both side surfaces of the active pattern 15, a first gate electrode 35 that extends from the gate insulation layer and the first hard mask layer 25 in the second direction, a second gate electrode 40 that is formed on a top surface of the first gate electrode 35 and a top surface of the first hard mask layer, and a second hard mask layer 45 that is formed on a top surface of the second gate electrode 40.

The first gate electrode 35 may control the channel (not shown). The first gate electrode 35 may be formed, for example, using polycrystalline silicon, polycrystalline silicon germanium, doped polycrystalline silicon, doped polycrystalline silicon, etc. A silicide layer or a metal layer may be formed as and/or on the second gate electrode layer 40. Examples of potential silicide layers include, but are not limited to, tungsten silicide layers, nickel silicide layers or titanium silicide layers. Examples of the metal layer include a tungsten layer, a tungsten nitride layer or a molybdenum layer.

In the embodiments depicted in FIG. 1, a central portion of the active pattern 15 is covered by the gate structure 50. As such, the source/drain regions are formed at the end portions of the active pattern 15 which are not covered by the gate structure 50. Dopants may be implanted onto surface portions of the source/drain regions of the active pattern 15, so that the source/drain regions are formed in the active pattern symmetrically with respect to the gate structure 50.

As is also shown in FIG. 1, a first insulation interlayer 55 may be formed on the device isolation layer 30. The top surface of the first insulation interlayer 55 may be substantially coplanar with the top surface of the first hard mask layer 25. As is also shown in FIG. 1, a gate spacer 60 may be formed on the first insulation interlayer 55 along the side surfaces of the second gate electrode 40 and the side surfaces of the second hard mask layer 45. In the depicted embodiments, the gate spacer 60 is not formed along the side surface of the active pattern 15. Thus, the gate spacer 60 is not formed along the side surfaces of the source/drain regions 15a of the active pattern.

As is further shown in FIG. 1, a second insulation interlayer 65 may be formed on the first insulation interlayer 55. The top surface of the second insulation interlayer 65 may be substantially coplanar with the top surface of the gate structure 50. As shown in FIG. 1, the gate spacer 60 may be covered by the second insulation interlayer 65.

A semiconductor layer 70 may be formed on the device isolation layer 30 between the first insulation interlayer 55 and the active pattern 15 including the first hard mask layer 25 thereon. The bottom surface of the semiconductor layer 70 may be substantially coplanar with the bottom surface of the first gate electrode 35. When the bottom surface of the semiconductor layer 70 is lower than that of the first gate electrode 35, electrons may move between the semiconductor layers corresponding to the source/drain regions under the gate structure 50 when an operating voltage is applied to the fin FET. Such electron flow is widely known as a punch-through phenomenon, and may result because dopants have been heavily implanted onto the surface portions of the active pattern corresponding to the source/drain regions at a concentration of, for example, about $10^{19}$ atoms/cm$^2$ or more. Examples of the semiconductor layer include a single crystalline silicon layer, a single crystalline silicon germanium layer and/or a single crystalline germanium layer. The semiconductor layer 70 may be heavily or lightly doped at surface portions of the source/drain regions of the active pattern 15.

As is also shown in FIG. 1, a contact pad 75 may be formed on the semiconductor layer 70. The contact pad 75 may partially penetrate the second insulation interlayer 65, and may comprise, for example, a doped polysilicon layer or a metal layer. Although not shown in FIG. 1, a silicide layer may be interposed between the semiconductor layer 70 and the contact pad 75. Such a silicide layer may facilitate reducing the electrical resistance of the contact pad 75.

The source/drain regions 15a, the semiconductor layer 70 and the contact pad 75 may form an n−/n+/contact pad junction structure. This may facilitate reducing the electrical resistance of the source/drain regions 15a and may improve the performance and speed of the fin FET device.

Figure 2A:
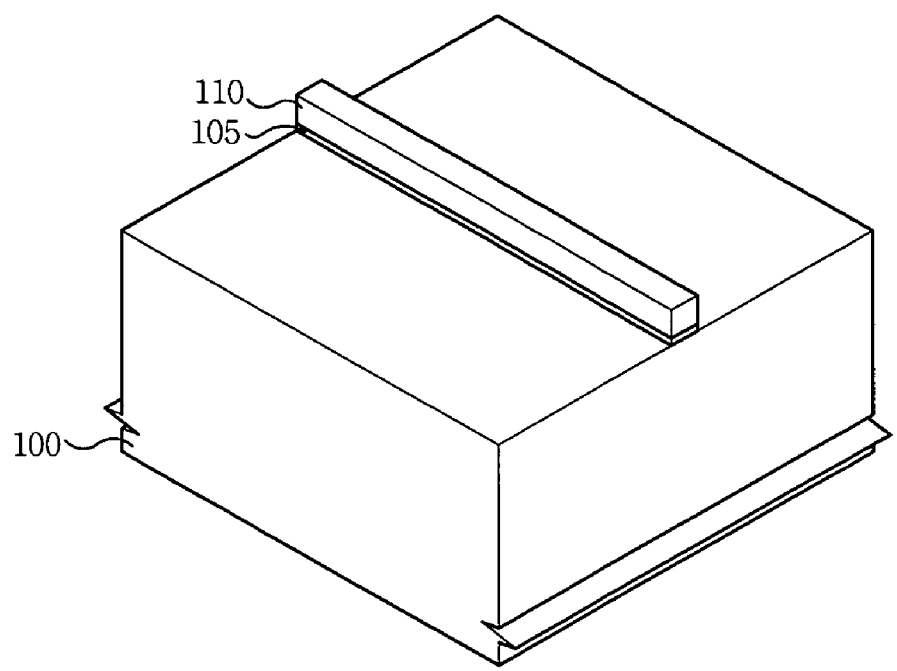
FIGS. 2A to 2N are perspective views illustrating processing steps for forming the fin FET shown in FIG. 1.
Figure 2B:
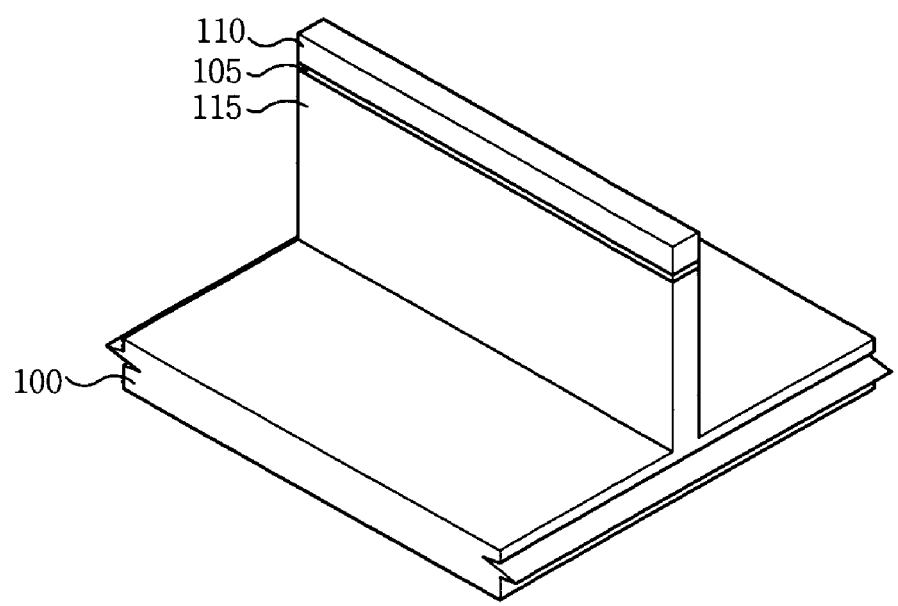
Figure 2C:
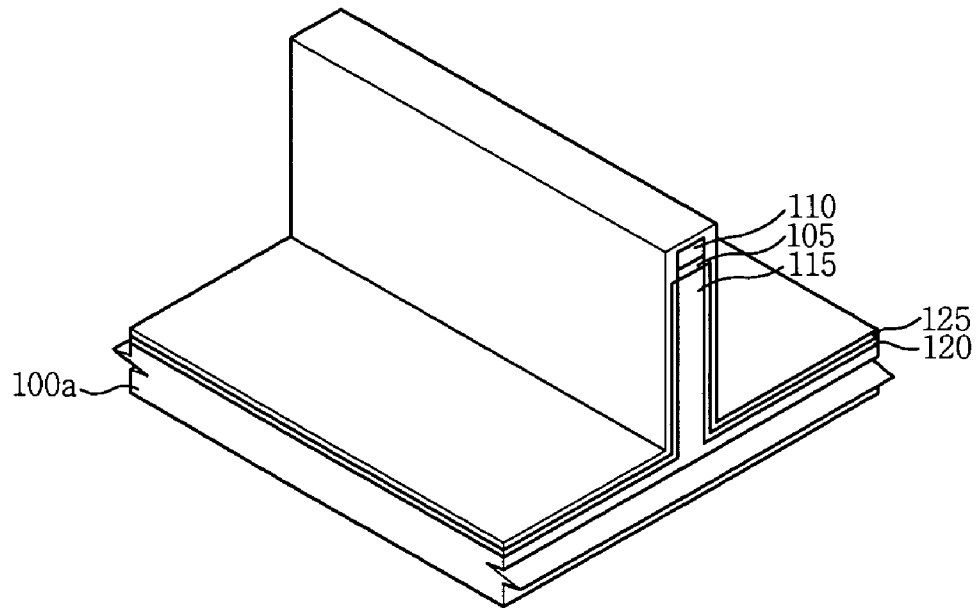
Figure 2D:
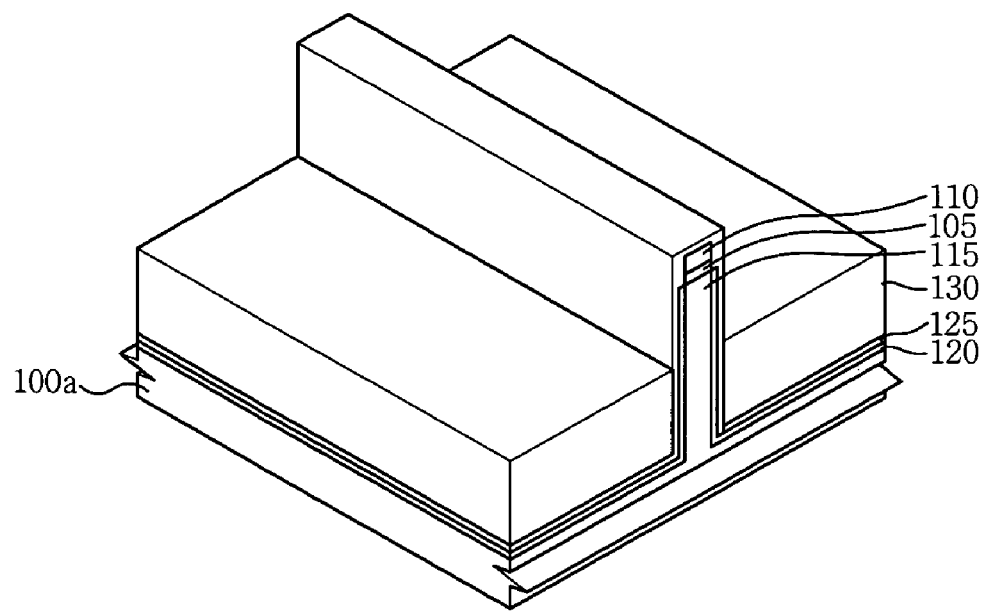
Figure 2E:
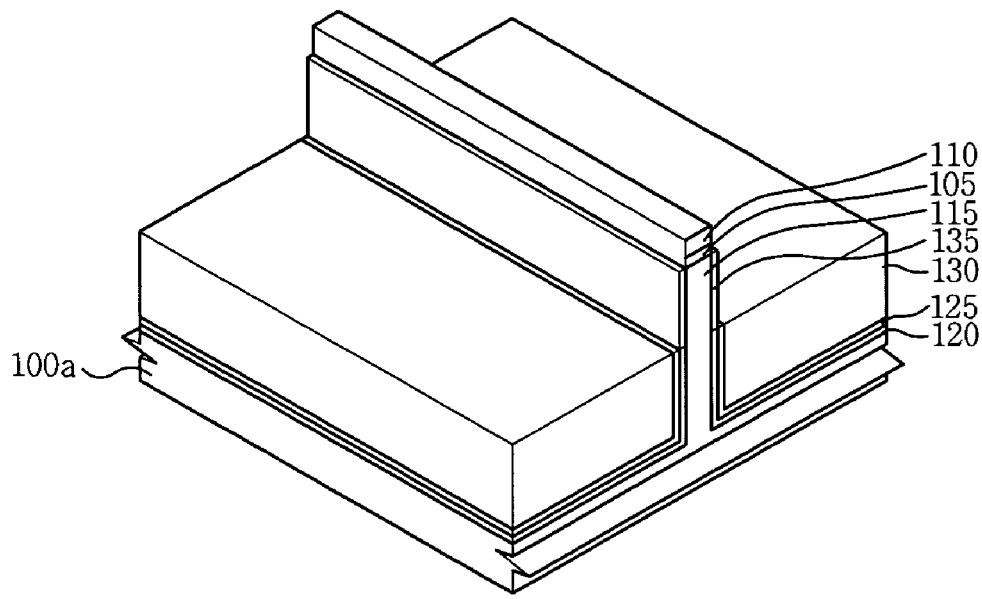
Figure 2F:
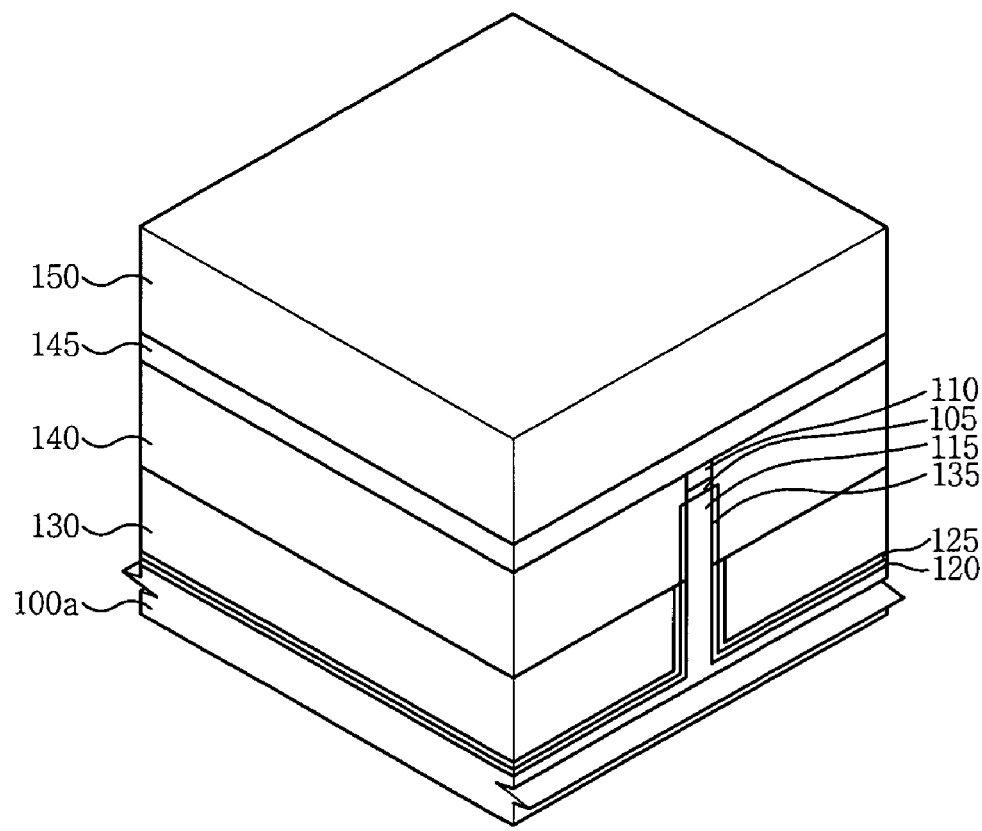
Figure 2G:
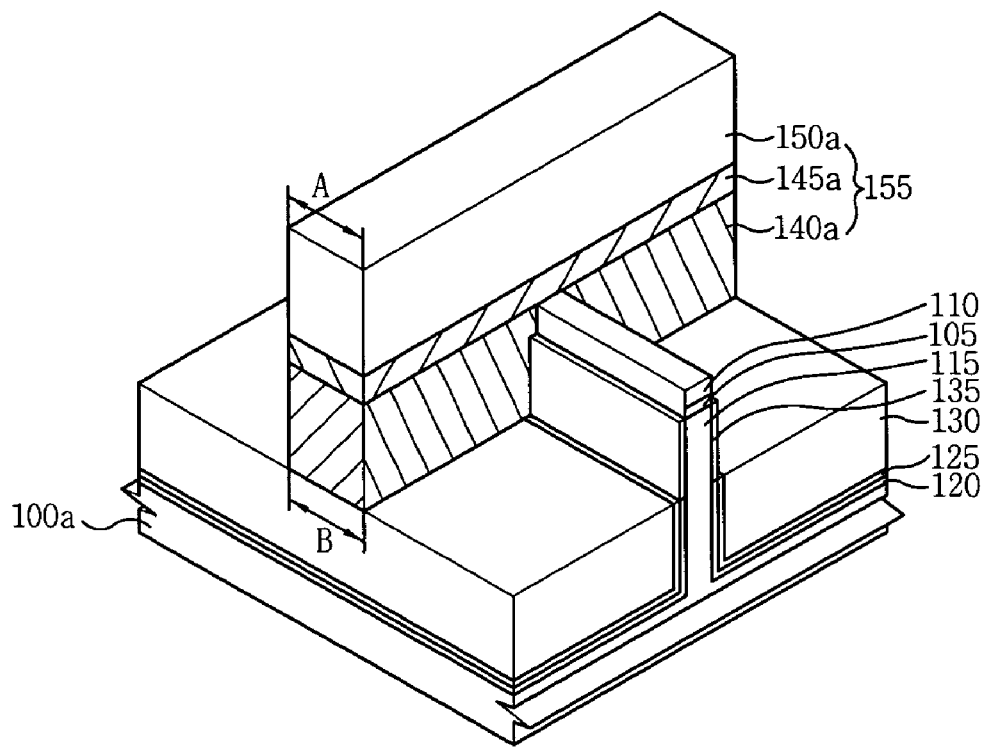
Figure 2H:
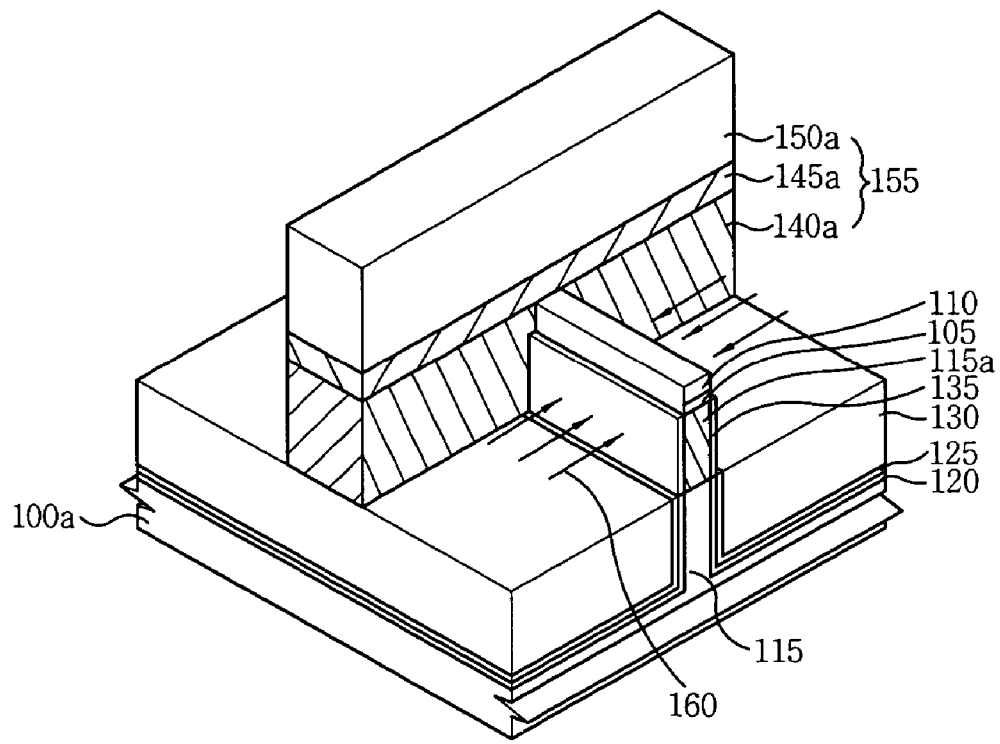
Figure 2I:
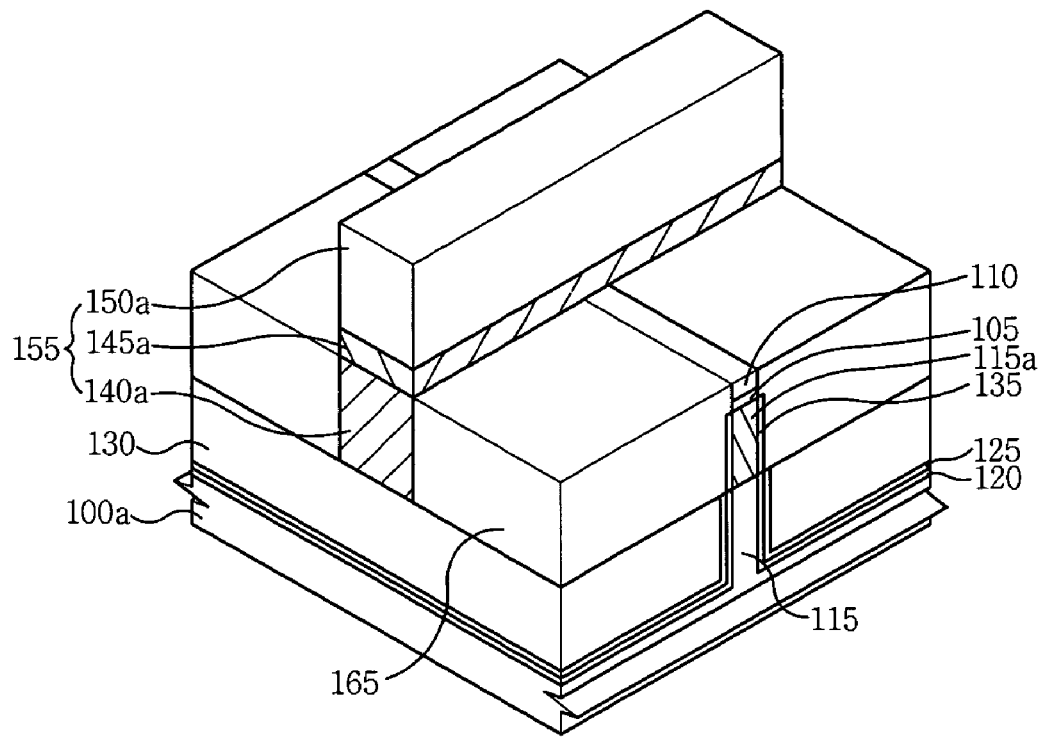
Figure 2J:
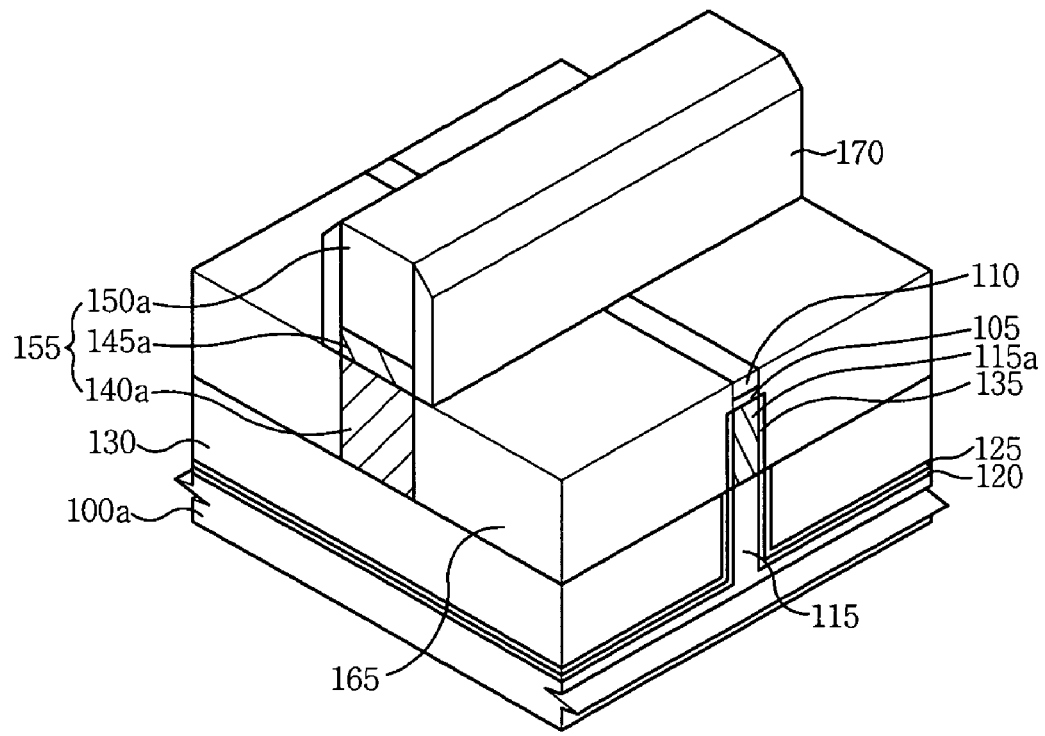
Figure 2K:
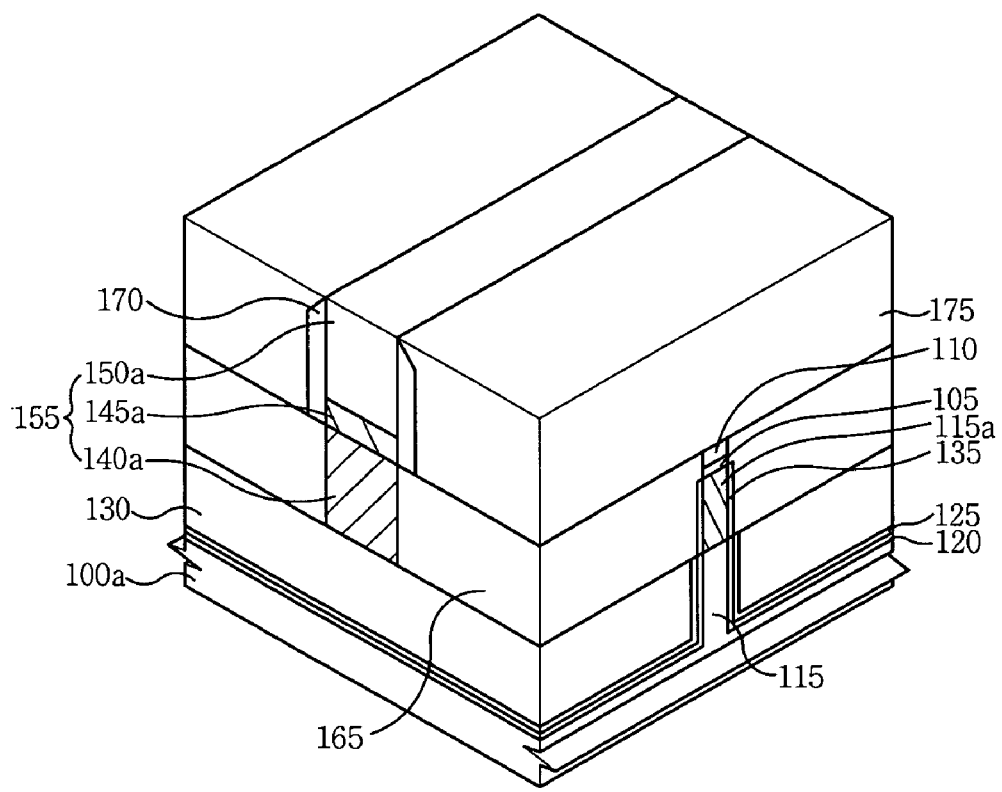
Figure 2L:
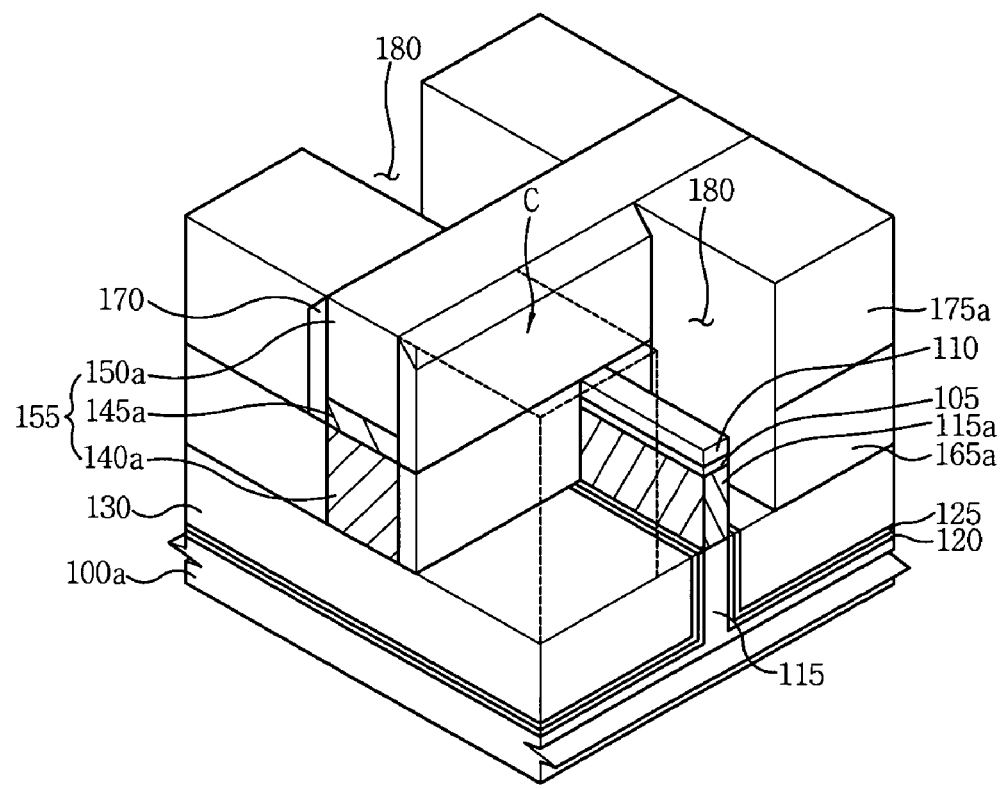
Figure 2M:
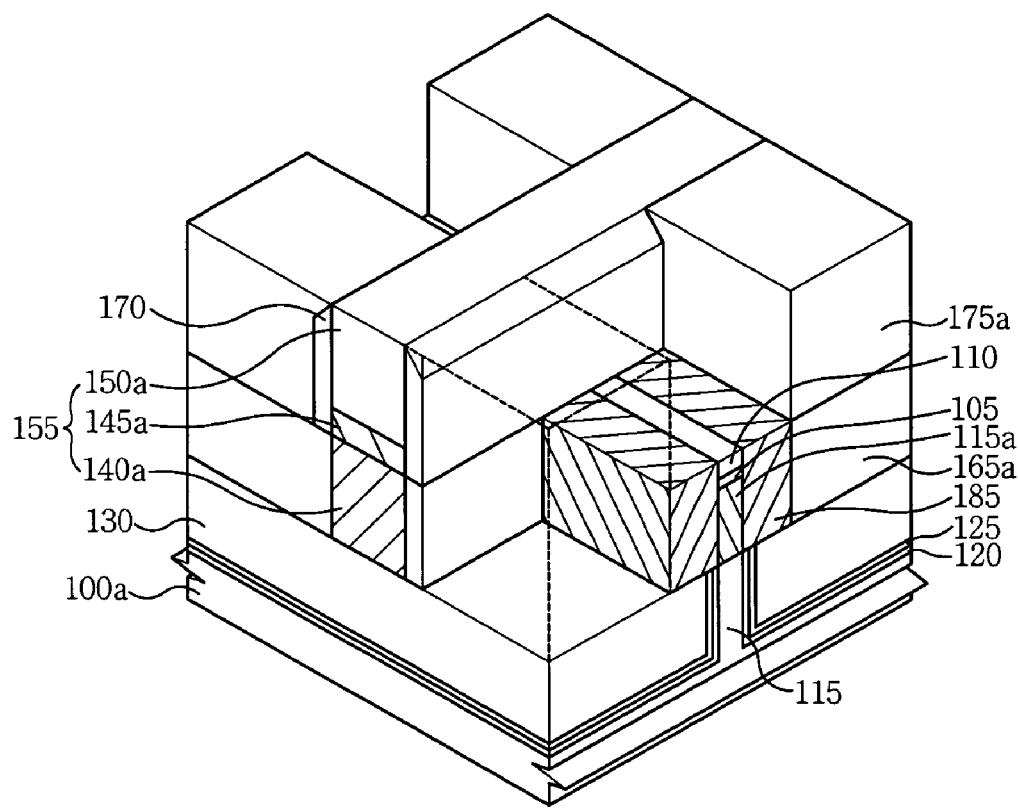
Figure 2N:
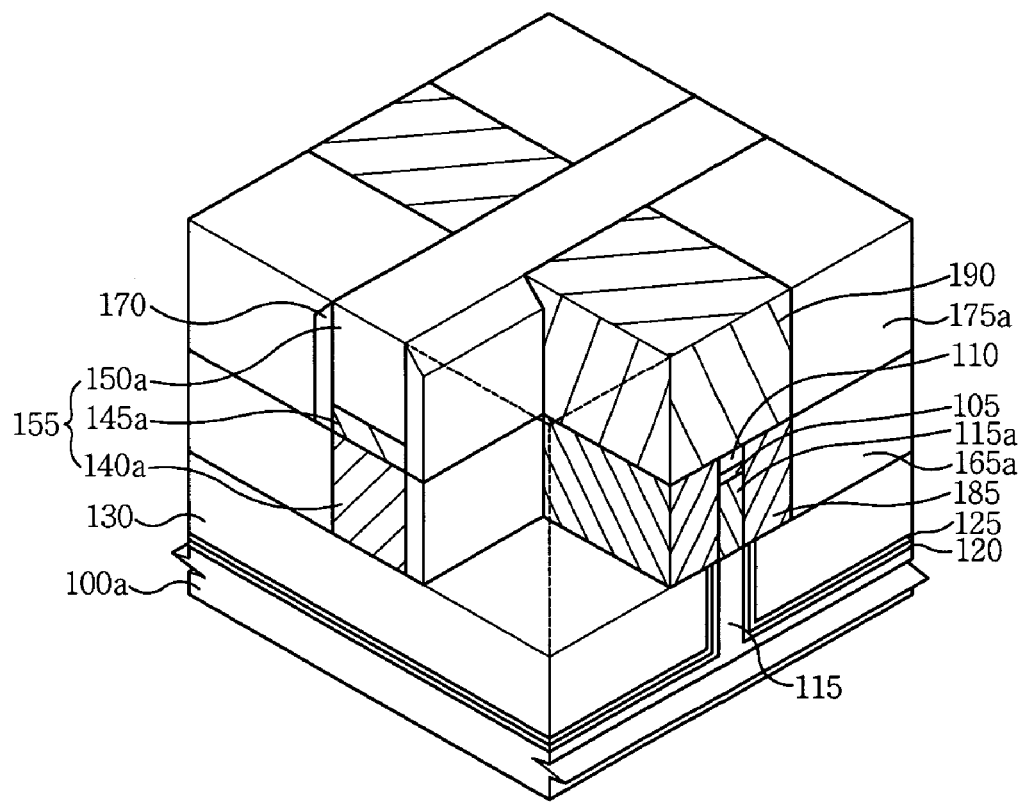

FIGS. 2A to 2N are perspective views illustrating processing steps for forming the fin FET shown in FIG. 1.

Referring to FIG. 2A, a pad oxide layer (not shown) is formed on a silicon substrate 100 using, for example, a thermal oxidation process. The pad oxide layer in certain embodiments of the present invention may have a thickness on the order of about 100 Å. A first hard mask layer (not shown) is formed on the pad oxide layer by a CVD process to a thickness of, for example, about 700 Å. The pad oxide layer may, for example, comprise a silicon nitride (SiN) layer.

A photoresist may then be deposited on the first hard mask layer to form a photoresist film (not shown) on the first hard mask layer. The photoresist film may then be partially removed from the first hard mask layer using any conventional photolithography process, to form a first photoresist pattern (not shown) that is formed in a first direction. The first hard mask layer and the pad oxide layer may then be partially dry-etched using the first photoresist pattern as an etching mask to form a first hard mask pattern 110 and a pad oxide pattern 105 on the substrate 100. The first photoresist pattern may then be removed using, for example, a conventional ashing process, a strip process and a cleaning process.

As shown in FIG. 2B, portions of the substrate 100 may then be removed using, for example, a dry etching process where the first hard mask pattern 110 is used as the etching mask. Via this process, the substrate 100 may be etched away to a predetermined depth except for a portion thereof under the first hard mask pattern 110. In this manner, an active pattern 115 may be integrally formed in the body of the substrate 100. As shown in FIG. 2B, the active pattern 115 protrudes from a surface of the etched substrate 100a. In certain embodiments of the present invention, the active pattern 115 protrudes to a height of at least about 2000 Å.

As shown in FIG. 2C, a sidewall oxide layer 120 may then be formed on the surface of the etched substrate 100a and on the side surfaces of the active pattern 115 using, for example, a thermal oxidation process. As a result, the stress applied to the active pattern 115 by the dry etching process may be alleviated. In alternative embodiments of the present invention, the sidewall oxide layer 120 may be formed on the surface of the etched substrate 100a, the side surfaces of the active pattern 115 and the pad oxide pattern 105, and side and top surfaces of the first hard mask pattern 110 by using a CVD process. A liner silicon nitride layer 125 may also be formed on the sidewall oxide layer 120 and possibly on the side surfaces of the pad oxide pattern 105 and on the top surface the first hard mask pattern 110 using, for example, a CVD process. The liner silicon nitride layer may reduce subsequent oxidation of the active pattern 115.

Next, a device isolation layer 130 may be formed on the silicon nitride layer 125. As shown in FIG. 2D, the top surface of the device isolation layer 130 may be lower than the top surface of the active pattern 115. In certain embodiments of the present invention, the device isolation layer may be formed as follows. First, an insulation layer (not shown) may be formed on the silicon nitride layer 125 using, for example, a CVD process (e.g., a high density plasma chemical vapor deposition or "HDPCVD" process) or via an SOG method so as to cover both the active pattern 115 and the first hard mask pattern 110. This insulation layer may then be removed and planarized using, for example, a chemical mechanical polishing (CMP) process until at least the top surface of the first hard mask pattern 110 is exposed. The planarized insulation layer may then be further removed using, for example, a dry or wet etch-back process until the top surface of the insulation layer is lower than the top surface of the active pattern 105. The remaining portion of the insulation layer after this etch back process may have a predetermined height from the surface of the silicon nitride layer 125. This remaining insulation layer functions as the device isolation layer 130, and the height of the device isolation layer 130 may be set, for example, to correspond to the height of the channel in the active pattern 115.

As shown in FIG. 2E, the portions of the silicon nitride layer 125 and the sidewall oxide layer 120 that extend above the top surface of the device isolation layer 130 may be removed to expose the portion of the side surface of the active pattern 115 that extends above the top surface of the device isolation layer 130. This exposed side surface of the active pattern 115 may then be thermally oxidized to form a gate insulation layer 135 on the portion of the side surface of the active pattern that extends above the top surface of the device isolation layer 130. A conventional CVD process or a radical oxidation process may, for example, be used to form the gate insulation layer 135.

Prior to formation of the gate insulation layer 135, a channel doping process may be performed using the liner silicon nitride layer 125 and the sidewall oxide layer 120 or using just the sidewall layer 120. In other embodiments of the present invention, the channel doping process may be performed using another buffer oxide layer (not shown) after the silicon nitride layer 125 and the sidewall oxide layer 120 are removed.

Referring to FIG. 2F, a first gate conductive layer (not shown) may next be formed on the device isolation layer 130 using, for example, a conventional CVD process. The first gate conductive layer may be formed to a predetermined thickness such that the gate insulation layer 135 and the first hard mask pattern 110 are covered by the first gate conductive layer. Then, the first gate conductive layer may be removed and planarized using, for example, a conventional CMP process until a top surface of the first hard mask pattern 110 is exposed, thereby forming a first gate conductive pattern 140. A second gate conductive layer 145 and a second hard mask layer 150 may then be sequentially formed on the first gate conductive pattern 140.

Referring to FIG. 2G, a photoresist film may then be formed on the second hard mask layer 150, and a conventional photolithography process may be performed on the photoresist film to form a second photoresist pattern (not shown) that extends in a second direction that is different than the first direction. In the embodiment of the present invention depicted in FIG. 2G, the second direction is substantially perpendicular to the first direction. The second hard mask layer 150, the second gate conductive layer 145 and the first gate conductive pattern 140 may then be patterned using, for example, a dry-etching process with the second photoresist pattern serving as the etching mask. By this process, a second hard mask pattern 150a, a second gate electrode 145a and a first gate electrode 140a may be formed on the device isolation layer 130 in the second direction to thereby form a gate structure 155. As shown in FIG. 2G a portion of the active pattern 115 and the first hard mask pattern 110 (which, as noted above, extend in the first direction) are covered by the first and second gate electrodes 140a and 145a. The exposed side surfaces of the active pattern 115 that are not covered by the gate structure 155 and that are not protected by the gate insulation layer 135 are formed into source/drain regions in subsequent processing steps. The first hard mask pattern 110 may facilitate preventing the active pattern from being damaged during the above-mentioned dry-etching process.

In the embodiment depicted in FIG. 2G, the dry-etching process may be performed such that the upper width A of the upper portion of the gate structure 155 is substantially identical to the width B of the lower portion of the gate structure 155.

As shown in FIG. 2H, dopants may be implanted onto surface portions of the exposed side surface of the active pattern 115 to form source/drain regions 150a in the active pattern 115. The second photoresist pattern may be removed from the etched substrate 100a using, for example, an ashing process and a strip process.

Referring to FIG. 2I, a first dummy insulation layer (not shown) may next be formed on the device isolation layer 130 using, for example, a conventional HDPCVD process. The first dummy insulation layer may be formed to a predetermined thickness such that the second hard mask pattern 150a is covered by the first dummy insulation layer. Then, the first dummy insulation layer may be removed and planarized using, for example, a conventional CMP process until a top surface of the second hard mask pattern 150a is exposed, so that the first dummy insulation layer remains at side portions of the gate structure 155. Subsequently, the first dummy insulation layer may be etched back using, for example, a dry etching process such that the top surface of the first dummy insulation layer is coplanar with the top surface of the first hard mask pattern 110 and the top surface of the first gate electrode 140a. By this process, the first insulation interlayer 165 may be formed on the device isolation layer 130. As shown in FIG. 2I, the top surface of the first insulation interlayer 165 may be coplanar with the top surfaces of the first hard mask pattern 110 and the first gate electrode 140a.

Next, a silicon nitride layer may be formed (not shown in the figures) on a top surface of the first insulation interlayer 165 using, for example, a CVD process. The silicon nitride layer may be formed to a thickness such that the second hard mask pattern 150a and the second gate electrode 145a are covered by the silicon nitride layer. Then, as shown in FIG. 2J, the silicon nitride layer may be etched back using, for example, a dry-etching process to form a gate spacer 170 on the top surface of the first insulation interlayer 165 and on side surfaces of the second hard mask pattern 150a and the second gate electrode 145a. The gate spacer 170 is not formed on the source/drain regions of the active pattern, so that the source/drain regions of the active pattern 115 may be sufficiently exposed in a subsequent processing step.

Referring to FIG. 2K, a second dummy insulation layer (not shown) may then be formed on the first insulation interlayer 165 using, for example, a conventional HDPCVD process. The second dummy insulation layer may be formed to a thickness such that the second hard mask pattern 150a, the second gate electrode 145a and the gate spacer 170 are each covered by the second dummy insulation layer. Then, the second dummy insulation layer may be removed and planarized using, for example, a conventional CMP process until the top surface of the second hard mask pattern 150a is exposed. This planarization process forms the second insulation interlayer 175 shown in FIG. 2K on the first insulation interlayer 165 such that a top surface of the second insulation interlayer 175 is coplanar with the top surface of the second hard mask pattern 150a.

In FIGS. 2L to 2N, a corner portion C of the fin FET is removed to better illustrate the inner structure of the fin FET according to the first embodiment of the present invention.

Next, a third photoresist pattern (not shown) may be formed on the second insulation interlayer 175 using, for example, a conventional photolithography process on a photoresist layer. Then, as shown in FIG. 2L, the second insulation interlayer 175 and the first insulation interlayer 165 may be sequentially and partially dry-etched away in the first direction using the third photoresist pattern as an etching mask. During this etching process, the gate insulation layer 135 may be completely etched away from the side surfaces of the source/drain regions 115a. As a result, both side surfaces of the source/drain regions 115a of the active pattern 115 may be partially or completely exposed. The first hard mask pattern 110 may act to protect the source/drain regions 115a from damage during the dry-etching process, and the processing conditions of the dry-etching process may be set such that the etching selectivity is relatively high with respect to the silicon nitride layer. Accordingly, an opening 180 is formed along the first insulation interlayer 165 and the second insulation interlayer 175, and thus both side surfaces of the source/drain regions 115a and the first hard mask pattern 110 may be exposed.

As shown in FIG. 2M, a relatively heavily doped semiconductor layer 185 may next be formed on side surfaces of the source/drain regions 115a and the pad oxide layer 105 and on the top and side surfaces of the first hard mask pattern 110. This semiconductor layer 185 may facilitate reducing the electrical resistance of the source/drain regions 115a. A selective epitaxial growth (SEG) process may be used in conjunction with an in-situ implantation and/or doping process to form the heavily doped semiconductor layer 185. The dopant implantation process may be performed after the SEG process. As shown in FIG. 2M, the heavily doped semiconductor layer 185 may be formed on the entire side surfaces of the source/drain regions 115a.

Referring to FIG. 2N, a contact pad 190 may then be formed on the first hard mask layer 110 and the semiconductor layer 185. The contact pad 190 may, in certain embodiments of the present invention, fill the opening 180. The contact pad 190 may be formed, for example, by depositing doped polycrystalline silicon or a metal onto surfaces of the semiconductor layer 185 and the second insulation interlayer pattern 175a using a conventional CVD process. Then, the doped polycrystalline silicon or metal layer is removed and planarized until the surface of the second insulation interlayer pattern 175a is exposed, so that the doped polycrystalline silicon layer or the metal layer only remains on the first hard mask pattern and the semiconductor layer in the opening 180, thereby forming the contact pad 190. Furthermore, although not shown in FIG. 2N, a silicide layer may be formed between the semiconductor layer 185 and the contact pad 190.

Accordingly, as shown in FIG. 2N, pursuant to embodiments of the present invention the side surfaces of the source/drain regions 115a may be free of any spacers, and the contact area of the source/drain regions 115a with which the contact pad 190 makes contact may be enlarged as compared to conventional fin FET devices due to the semiconductor layer 185.

Figure 3:
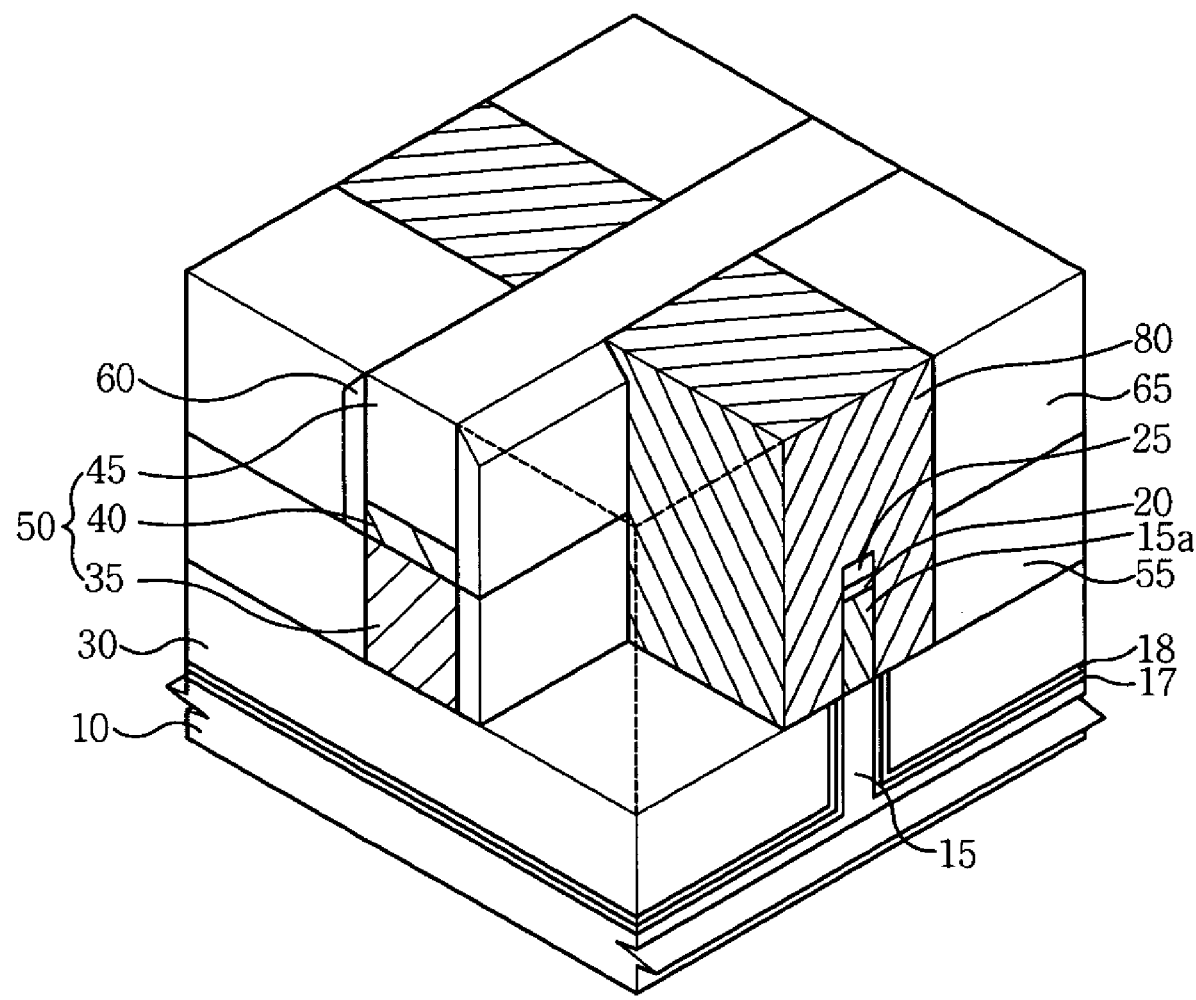
FIG. 3 is a perspective view illustrating a fin FET according to second embodiments of the present invention.

FIG. 3 is a perspective view illustrating a fin FET according to second embodiments of the present invention. Once again, a corner portion of the fin FET has been removed to better illustrate the inner structure of the transistor in detail, and the outer profile of the removed portion is depicted as a dotted line in FIG. 3. The embodiments of the present invention depicted in FIG. 3 have the same structure as the embodiments of the present invention depicted in FIG. 1 except that the semiconductor layer 70 of FIG. 1 is absent in the embodiment of FIG. 3, and in the embodiment of FIG. 3 the contact pad 80 extends all the way down to the top surface of the device isolation layer 30. As the embodiments depicted in FIGS. 1 and 3 include many of the same constituent parts, the same reference numerals have been used in FIGS. 1 and 3 to denote identical elements, and detailed descriptions of these like elements are omitted herein to avoid redundancy.

As shown in FIG. 3, a contact pad 80 is formed on the device isolation layer 30. The contact pad 80 penetrates the first insulation interlayer 55 and the second insulation interlayer 65, so that the source/drain regions 15a of the active pattern 15 and the first hard mask pattern 25 are covered by the contact pad 80, and so that the contact pad 80 may be in direct contact with the source/drain regions 15a. In exemplary embodiments of the present invention, the contact pad 80 may comprise a doped polysilicon layer or a metal layer. As is also shown in FIG. 3, no spacer is provided on the side surfaces of the source/drain region 15a, and the contact area of the source/drain regions 15a to the contact pad 80 is enlarged as compared to a conventional fin FET.

Figure 4A:
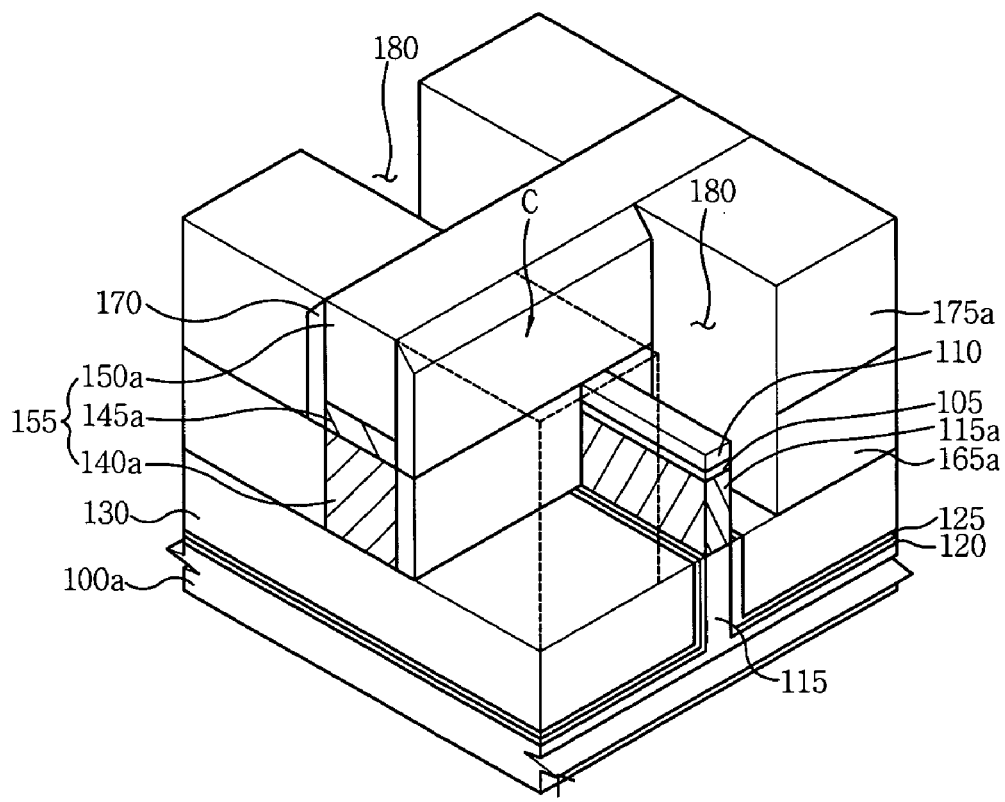
FIGS. 4A to 4B are perspective views illustrating processing steps for forming the fin FET shown in FIG. 3.
Figure 4B:
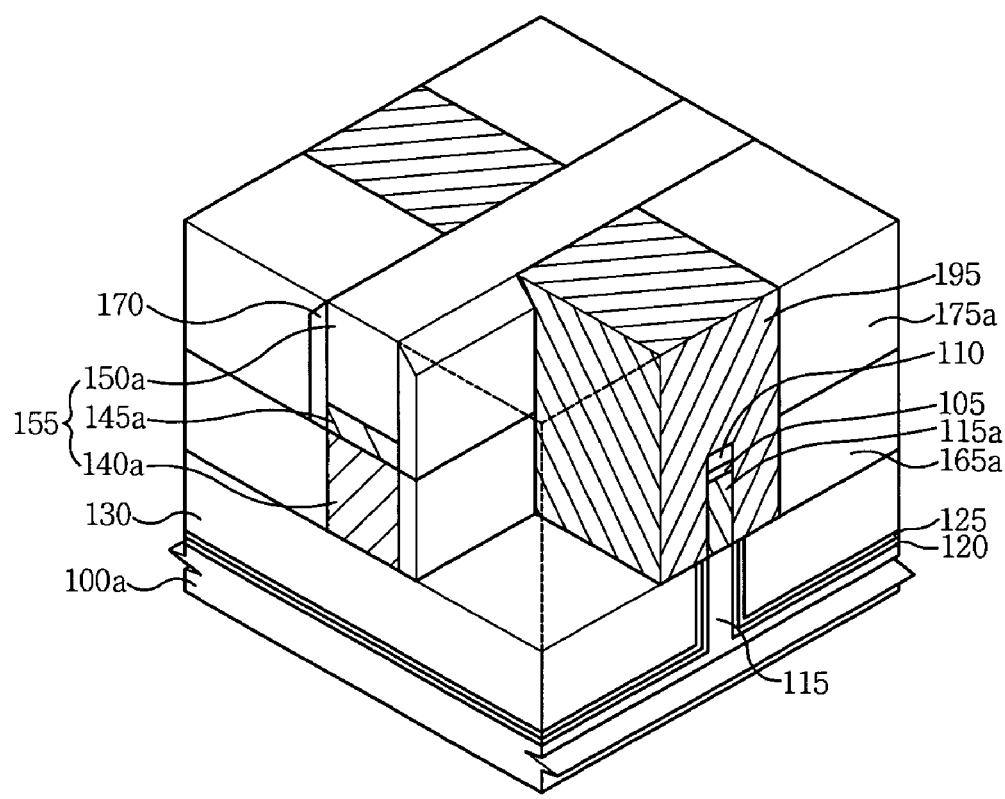

FIGS. 4A and 4B are perspective views illustrating processing steps for forming the fin FET shown in FIG. 3. Processing steps identical to the processing steps described above with reference with FIGS. 2A to 2K are first applied in forming the device of FIG. 3. As these processing steps have already been fully described above, further discussion of these processing steps will be omitted here to avoid redundancy.

Referring to FIG. 4A, a third photoresist pattern (not shown) is formed on the second insulation interlayer 175 using, for example, a conventional photolithography process on a photoresist layer that is formed on the second insulation interlayer 175. Then, the second insulation interlayer 175 and the first insulation interlayer 165 are sequentially and partially dry-etched away in the first direction using the third photoresist pattern as an etching mask, and the gate insulation layer 135 is completely etched away from the side surfaces of the source/drain regions 115a. As a result, both side surfaces of the source/drain regions 115a of the active pattern 115 are exposed. The first hard mask pattern 110 may help reduce and/or minimize damage to the source/drain regions 115a during the dry-etching process, and the processing conditions of the dry-etching process may be set such that the etching selectivity is relatively high with respect to the silicon nitride layer. As shown in FIG. 4A, the dry etching process may be used to form an opening 180 in the first insulation interlayer 165 and the second insulation interlayer 175 that exposes the both side surfaces of the source/drain regions 115a and the first hard mask pattern 110.

As shown in FIG. 4B, next a contact pad 195 may be formed on side surfaces of the source/drain regions 115a, on the pad oxide layer 105, on the first hard mask pattern 110 and on the device isolation layer 130 in the opening 180. In one specific embodiment of the present invention, the contact pad 195 is formed by depositing doped polycrystalline silicon onto surfaces of the device isolation layer 130 and the second insulation interlayer pattern 175a using a conventional CVD process to form a doped polycrystalline silicon layer on the second insulation interlayer pattern 175a to a thickness that fills the opening 180. In another exemplary embodiment, a metal layer may be sputtered onto surfaces of the device isolation layer 130 and the second insulation interlayer pattern 175a. Thereafter, the doped polycrystalline silicon layer or the metal layer may be removed and planarized until the surface of the second insulation interlayer pattern 175a is exposed, thereby forming the contact pad 195 in the opening 180.

As shown in FIG. 4B, in this embodiment no spacer remains on the side surfaces of the source/drain region 115a, and the contact area of the source/drain regions 115a are effectively enlarged.

Figure 5:
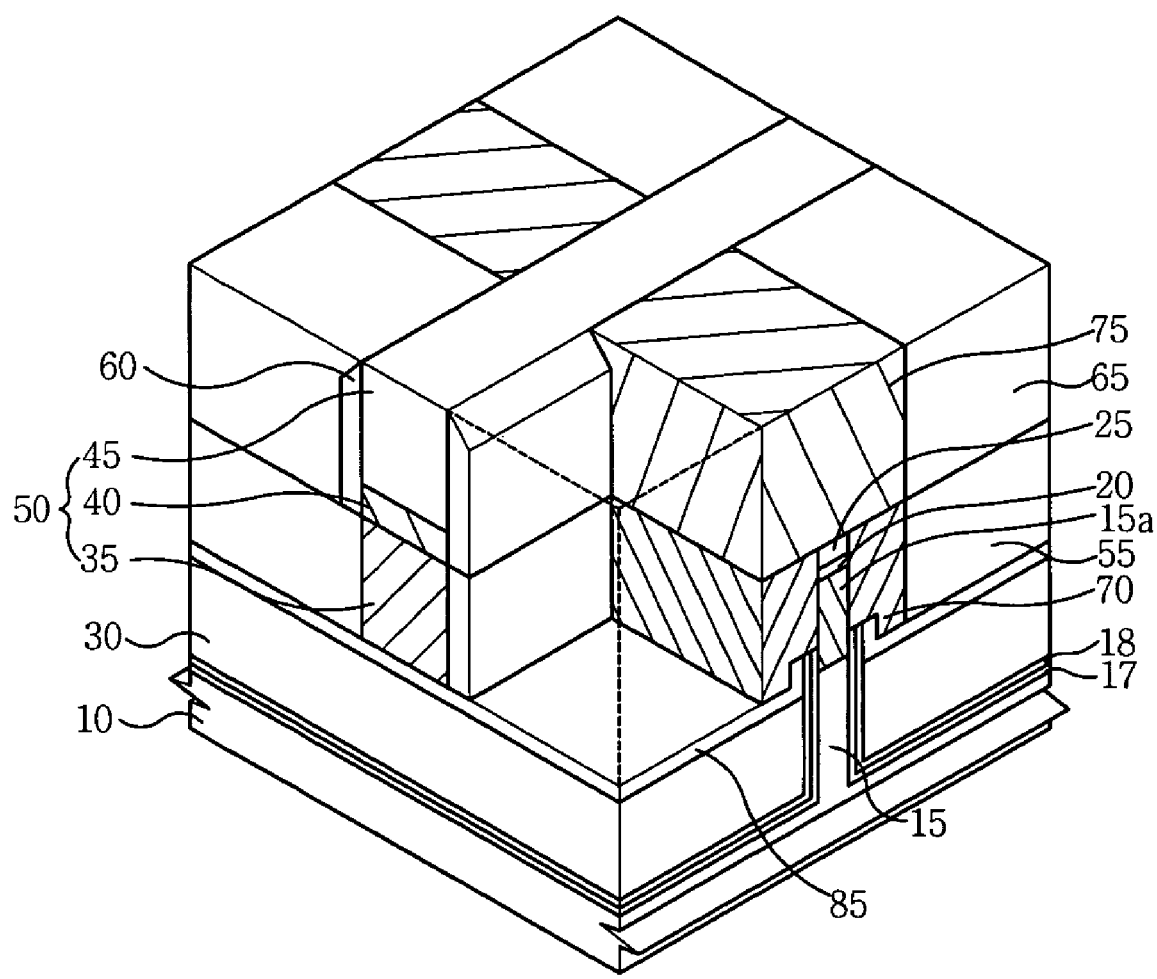
FIG. 5 is a perspective view illustrating a fin FET according to third embodiments of the present invention.

FIG. 5 is a perspective view illustrating a fin FET according to another embodiment of the present invention. A corner portion of the fin FET is removed to better illustrate the inner structure of the transistor, and an outer profile of the removed portion is depicted as a dotted line in FIG. 5. The embodiment of the present invention depicted in FIG. 5 has the same structure as the embodiment of the present invention depicted in FIG. 1, except that an etch stop layer 85 is further formed on the device isolation layer 30 to help reduce or prevent the punch-trough phenomenon. As the devices depicted in FIGS. 1 and 5 include many of the same constituent parts, the same reference numerals have been used in FIGS. 1 and 5 to denote identical elements, and detailed descriptions of these like elements are omitted herein to avoid redundancy.

As shown in FIG. 5, the etch stop layer 85 is formed on the device isolation layer 30, and may comprise, for example, a silicon nitride layer. The etch stop layer 85 may reduce and/or prevent the semiconductor layer 70 from forming under the first gate electrode 35, so that the punch-through phenomenon is reduced, minimized and/or prevented.

Figure 6A:
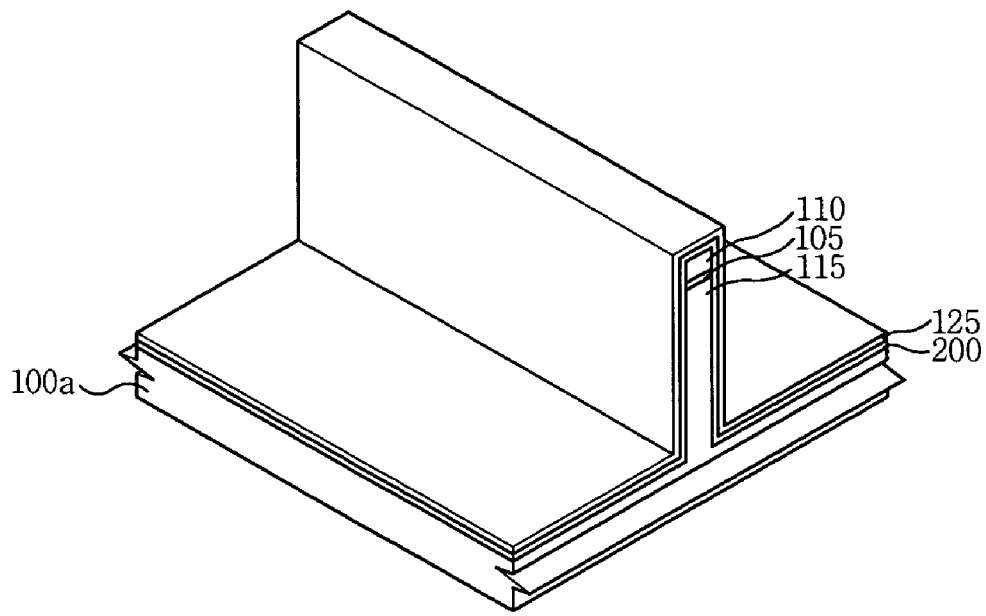
FIGS. 6A to 6H are perspective views illustrating processing steps for forming the fin FET shown in FIG. 5.

FIGS. 6A through 6H are perspective views illustrating processing steps for forming the fin FET shown in FIG. 5. Referring to FIG. 6A, a pad oxide layer (not shown) is formed on a silicon substrate 100 using, for example, a thermal oxidation process. Then, a first hard mask layer (not shown) is formed on the pad oxide layer by, for example, a CVD process. The first hard mask layer may comprise, for example, a silicon nitride (SiN) layer. Next, the first hard mask layer and the pad oxide layer may be partially dry-etched away in a first direction to form a first hard mask pattern 110 and a pad oxide pattern 105 on the substrate 100 in the first direction.

Then, the substrate 100 may be partially removed using, for example, a dry etching process with the first hard mask pattern 110 serving as an etching mask such that the substrate 100 is etched away to a predetermined depth except for the portion thereof under the first hard mask pattern 110. In this fashion, an active pattern 115 may be integrally formed in the substrate 100.

As is also shown in FIG. 6A, a sidewall oxide layer 200 may be formed on the surface of the etched substrate 100a and on a side surface of the active pattern 115 using, for example, a CVD process, to alleviate the stress applied to the active pattern 115 by the dry etching process. A liner silicon nitride layer 125 may then be formed on the sidewall oxide layer 200, on a side surface of the pad oxide pattern 105 and on a top surface the first hard mask pattern 110 using a CVD process. The silicon nitride layer 125 may reduce or prevent oxidation of the active pattern 115.

Figure 6B:
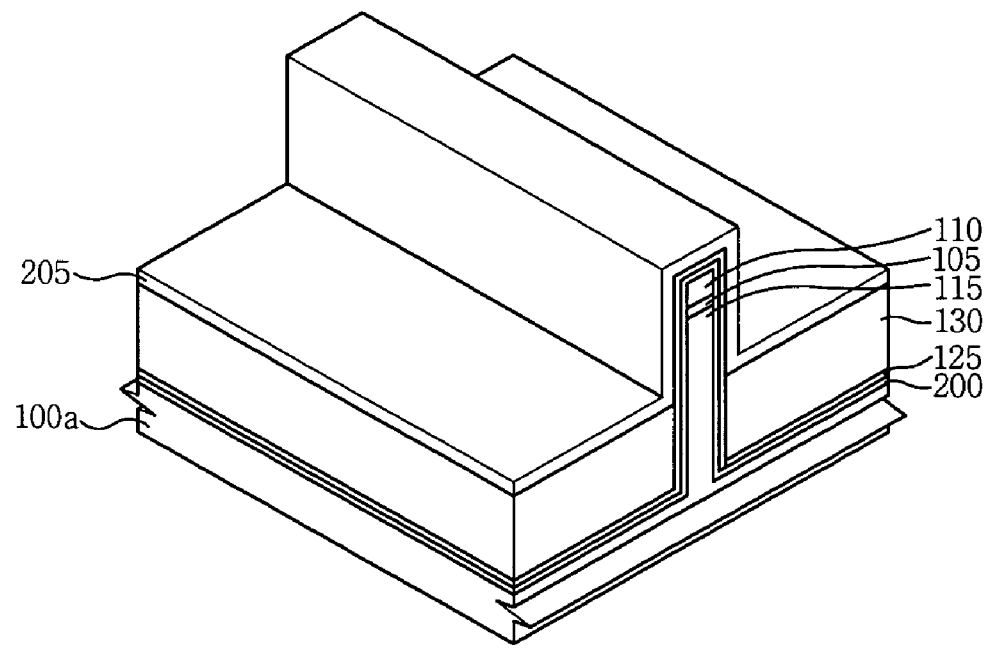

As shown in FIG. 6B, a device isolation layer 130 may be formed on the silicon nitride layer 125 such that a top surface of the device isolation layer 130 is lower than the top surface of the active pattern 115. The device isolation layer 130 may be formed, for example, using the methods described above with respect to FIG. 2D. An etch stop layer 205 may then be formed on the top surface of the device isolation layer 130 and on top and side surfaces of the sidewall oxide layer 200.

Figure 6C:
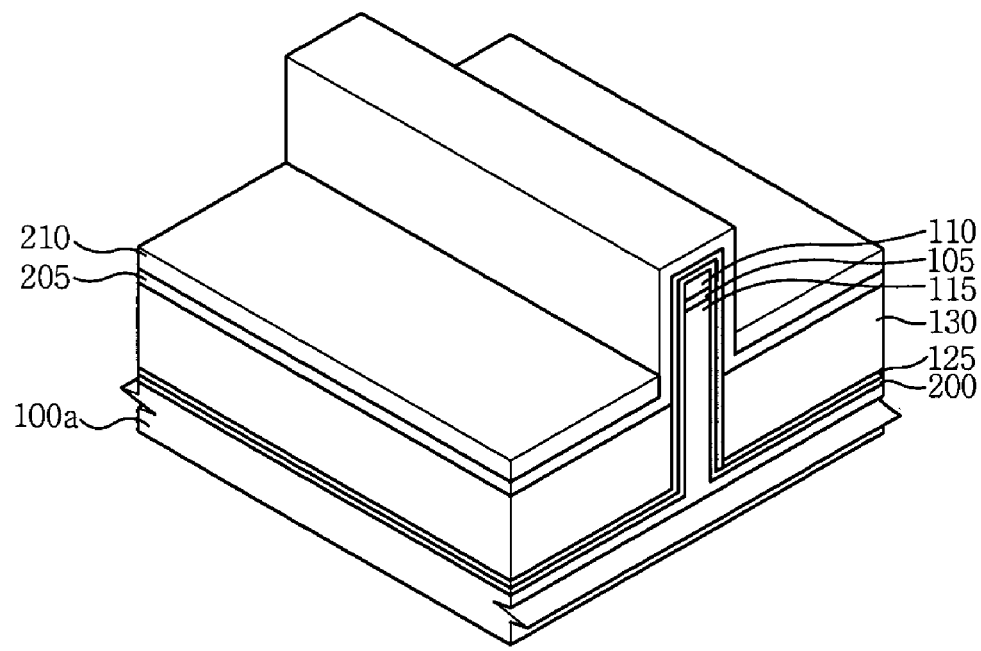

Referring to FIG. 6C, a sacrificial insulation layer (not shown) may then be formed on the etch stop layer 205 to a sufficient thickness to cover the active pattern 115 and the first hard mask pattern 110. The sacrificial insulation layer is then removed and planarized using, for example, a CMP process until a top surface of the first hard mask pattern 110 is exposed. The planarized sacrificial insulation layer may then be etched using, for example, a dry-etching process. As a result, a sacrificial insulation pattern 210 is formed on the etch stop layer 205. The sacrificial insulation pattern 210 may have a predetermined thickness from the top surface of the etch stop layer 205.

Figure 6D:
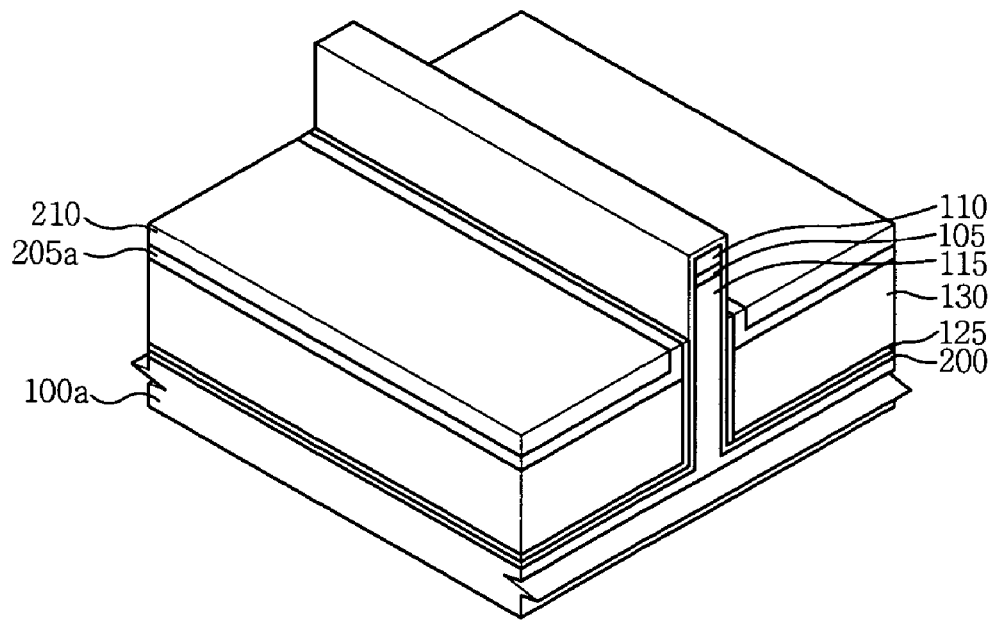

As shown in FIG. 6D, the etch stop layer 205 and the silicon nitride layer 125 may then be removed from side surfaces of the active pattern 115 and from the top surface of the first hard mask pattern 110 using, for example, a phosphate solution as an etchant. In this processing step, the sacrificial insulation pattern 210 may function as an etching mask, so that an etch stop layer 205a remains on the device isolation layer 130. The first hard mask pattern 110 is also protected during the above wet etching process by the sidewall oxide layer 200.

Figure 6E:
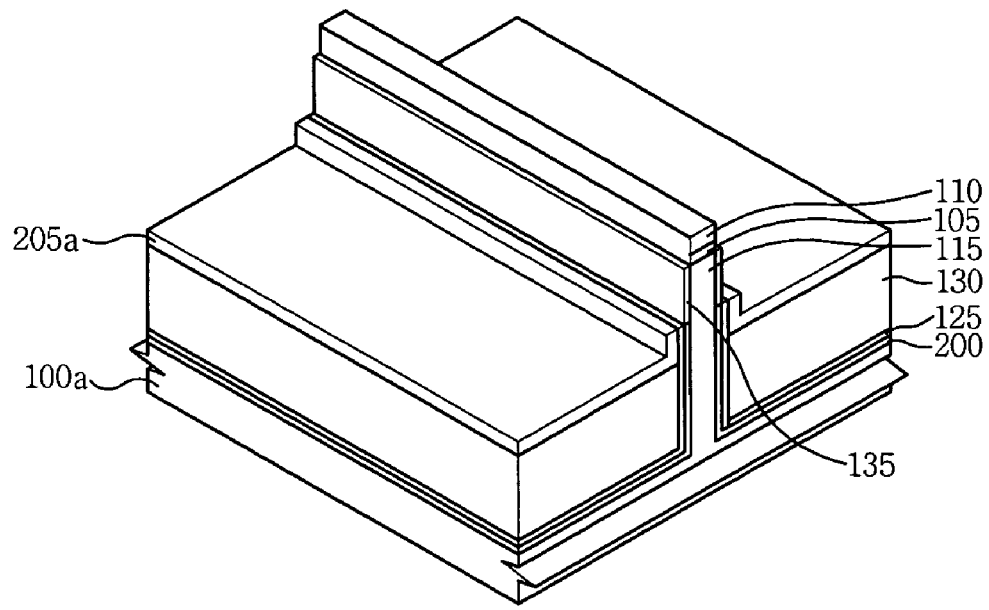

Next, as shown in FIG. 6E, the sacrificial insulation layer pattern 210 and the oxide sidewall pattern 200 are etched away using etchant(s) having etching selectivity with respect to the first hard mask pattern 110. Then, a thermal oxidation process is performed on an exposed side surface of the active pattern 115 to form the gate insulation layer 135.

Subsequently, the processing steps as described with reference with FIGS. 2F to 2K may be performed. As these processing steps have already been fully described above, they will not be repeated herein.

Figure 6F:
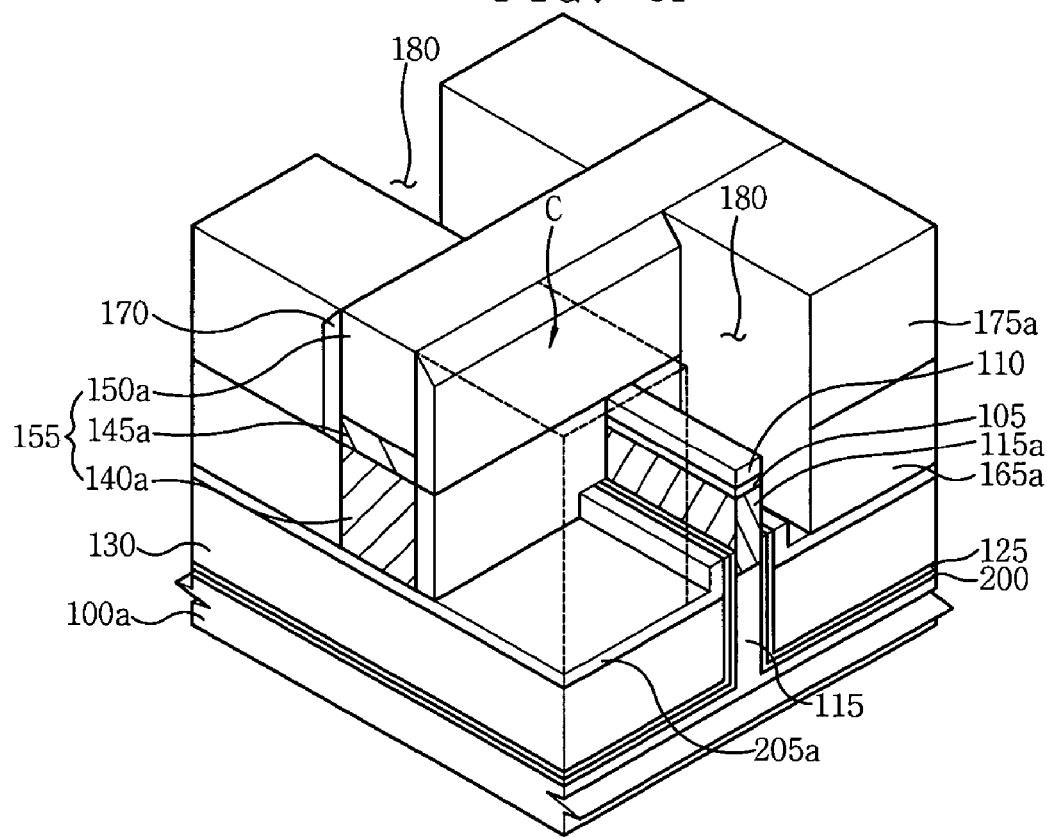
Figure 6G:
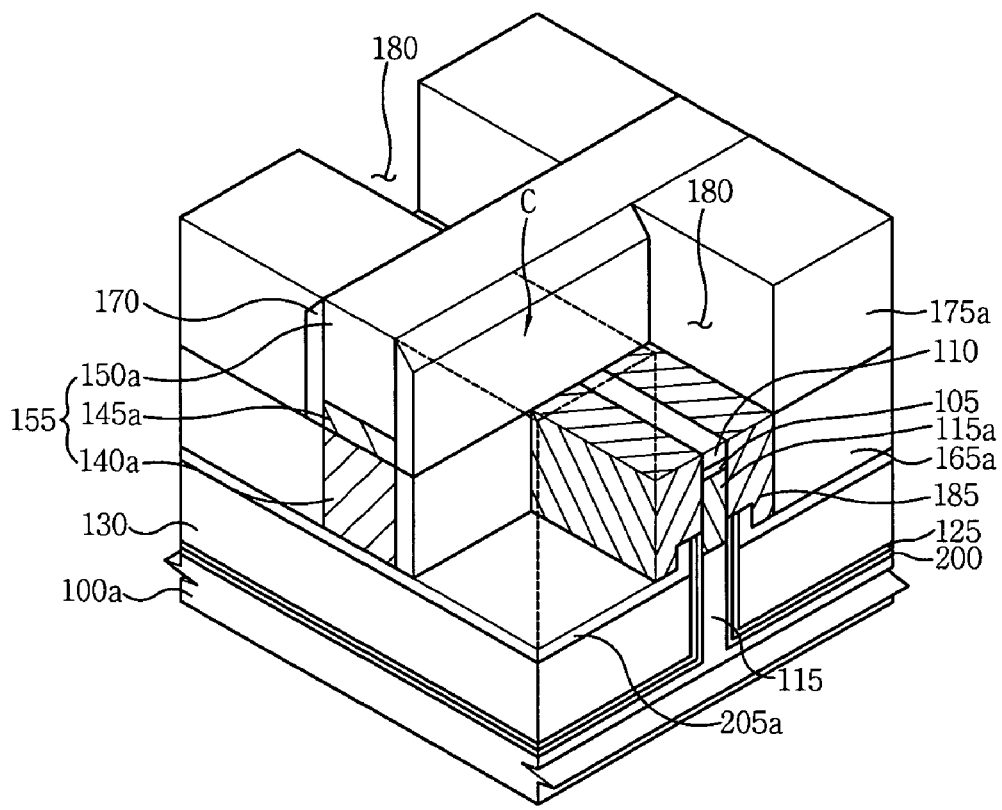
Figure 6H:
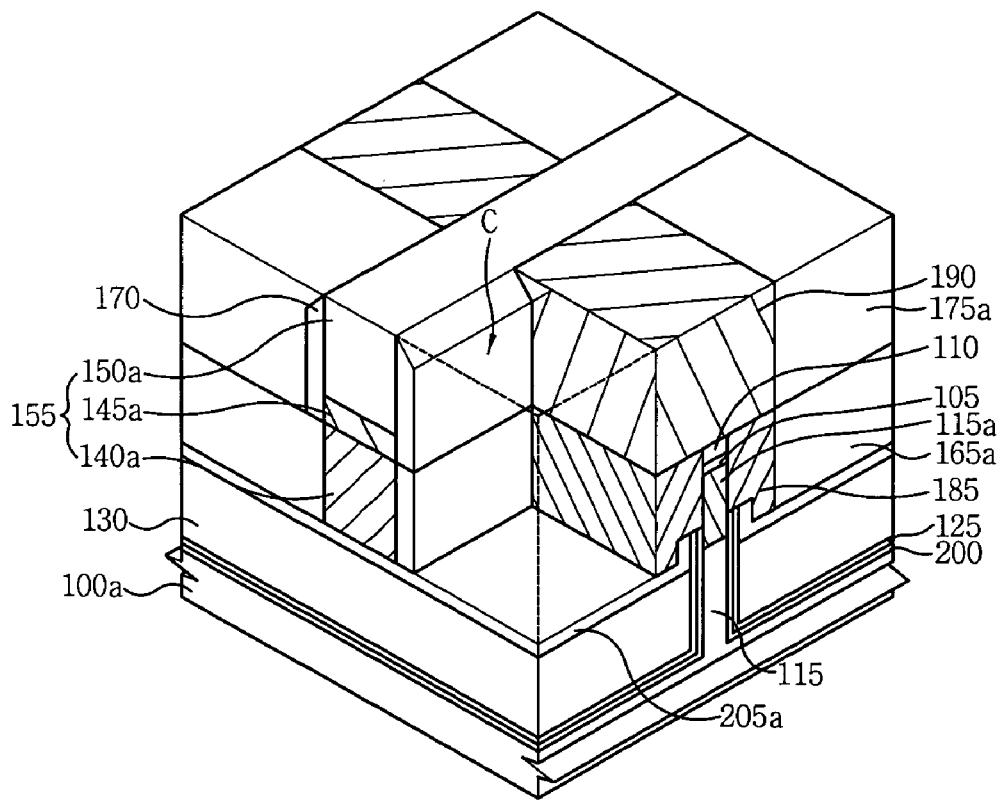

FIGS. 6F through 6H illustrate the processing steps that may be used to complete fabrication of the device of FIG. 5. In FIGS. 6F through 6H, a corner portion C of the fin FET is removed to better illustrate the inner structure of the fin FET.

Referring to FIG. 6F, a third photoresist pattern (not shown) is formed on the second insulation interlayer 175 using, for example, a conventional photolithography process on a photoresist layer that is deposited on the second insulation interlayer 175. Then, the second insulation interlayer 175 and the first insulation interlayer 165 may be sequentially and partially dry-etched in the first direction using the third photoresist pattern as an etching mask, and the gate insulation layer 135 may be completely etched away from the side surfaces of the source/drain regions 115a. As a result, both side surfaces of the source/drain regions 115a of the active pattern 115 may be exposed. The first hard mask pattern 110 may act to reduce or prevent damage to the source/drain regions 115a during the dry-etching process, and the processing conditions of the dry-etching process may be set such that the etching selectivity is relatively high with respect to the silicon nitride layer. In addition, the etch stop layer 205 may reduce or prevent damage to the device isolation layer 130 during the dry-etching process. Accordingly, an opening 180 may be formed in the first insulation interlayer 165 and the second insulation interlayer 175, and the side surfaces of the source/drain regions 115a and the first hard mask pattern 110 may be exposed.

As shown in FIG. 6G, a heavily doped semiconductor layer 185 may be formed on side surfaces of the source/drain regions 115a, the pad oxide layer 185 and the first hard mask pattern 110. This semiconductor layer 185 may facilitate reducing the electrical resistance of the source/drain regions 115a. Next, as shown in FIG. 6H, a contact pad 190 may be formed on the first hard mask layer 110 and the semiconductor layer 185 in the opening 180. As is apparent from FIG. 6H, the side surfaces of the source/drain region 115a are not in contact with a spacer and the contact area of the source/drain regions 115a is enlarged due to the semiconductor layer 185.

Figure 7:
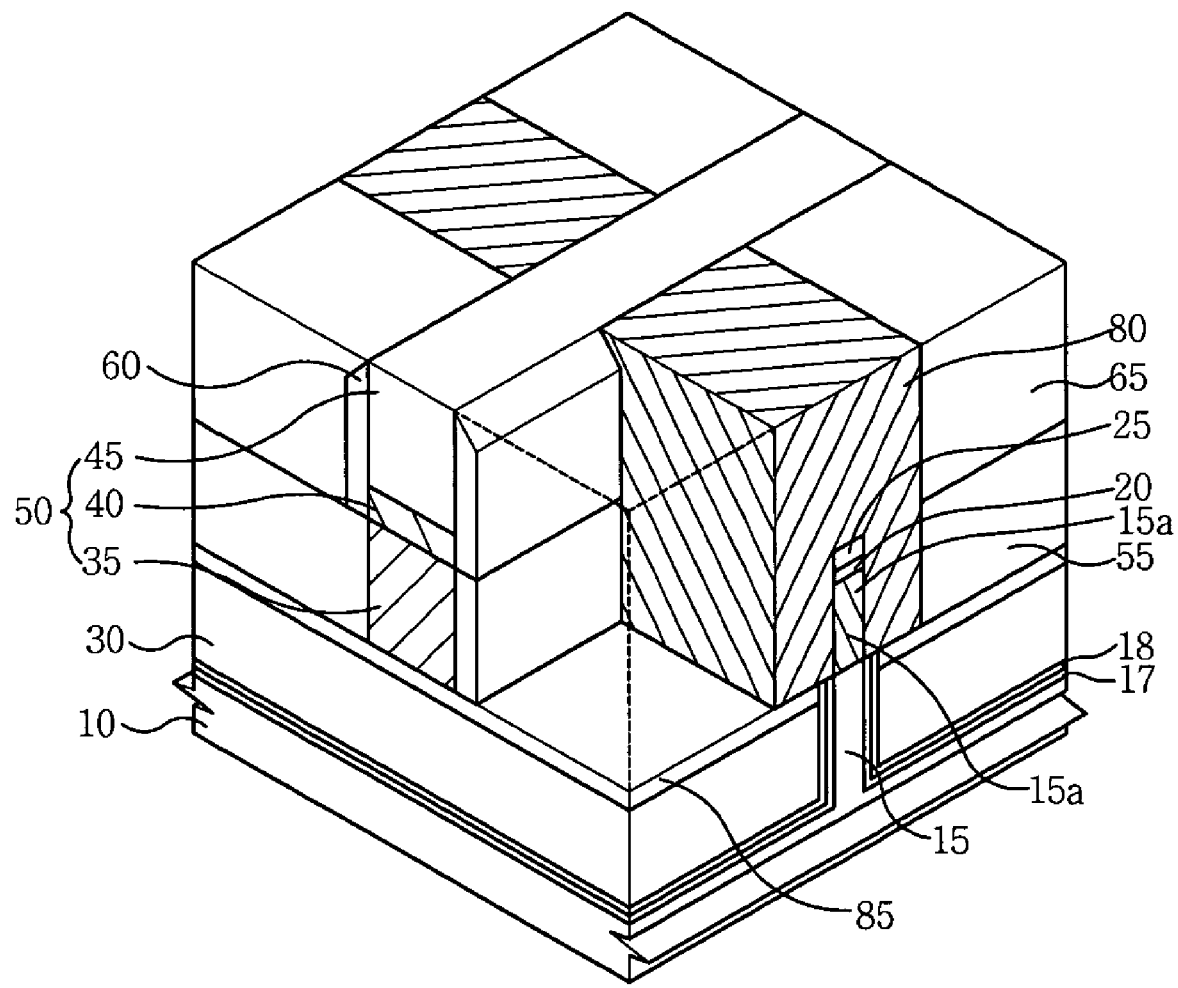
FIG. 7 is a perspective view illustrating a fin FET according to fourth embodiments of the present invention.

FIG. 7 is a perspective view illustrating a fin FET according to other embodiments of the present invention. A corner portion of the fin FET is removed to better illustrate the inner structure of the transistor. The outer profile of the removed portion is depicted as a dotted line in FIG. 7. The embodiment of the present invention depicted in FIG. 7 has the same structure as the embodiment of the present invention depicted in FIG. 5, except that in the embodiment of FIG. 7, the semiconductor layer 70 is not included and the contact pad 80 extends down to the top surface of the etch stop layer 85. In FIG. 7, like reference numerals are used to denote like elements in the embodiment of FIG. 5, and detailed descriptions of these like elements will be omitted to avoid redundancy.

As shown in FIG. 7, the etch stop layer 85 is formed on the device isolation layer 30, and a contact pad 80 is formed on the etch stop layer 85. The contact pad 80 penetrates the first insulation interlayer 55 and the second insulation interlayer 65 such that the source/drain regions 15a of the active pattern 15 and the first hard mask pattern 25 are covered by the contact pad 80. In the embodiment of FIG. 7, the contact pad 80 comes into direct contact with the source/drain regions 15a. As is apparent from FIG. 7, no spacer remains on the side surfaces of the source/drain region 15a, and the contact area between the source/drain regions 15a and the contact pad 80 is enlarged.

The fin FET depicted in FIG. 7 may be fabricated using the methods described above with respect to the embodiments of the present invention depicted in FIGS. 3 and 5. As such, a detailed description of the method of manufacturing the fin FET of FIG. 7 will not be repeated here.

According to embodiments of the present invention, the spacer that is conventionally provided on the side surfaces of the source/drain regions may be partially or completely omitted. As a result, the contact area between the source/drain regions and the contact pad may be enlarged. In addition, in embodiments of the present invention that include a semiconductor layer, the fin FET may have a junction structure of n−/n+/contact pad which may reduce the electrical resistance of the source/drain regions. As a result, the semiconductor device including the fin FET may have improved performance and/or a high operation speed.

Herein, reference is made to active patterns that "protrude vertically" from a substrate. It will be understood that this term is meant to encompass both active patterns that are deposited on a substrate and active patterns that are formed by selectively removing portions of a substrate so that the remaining vertically protruded portion of the substrate comprises the active pattern.

It will be appreciated that the fin FETs of the present invention may be used in many different types of integrated circuits, including DRAM devices, SRAM devices, non-volatile memory devices or any other memory devices that include FETs that are known to one of the ordinary skill in the art.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A semiconductor device, comprising:
   a substrate;
   a semiconductor fin extending from a surface of the substrate;
   an isolation layer on the substrate and on portions of the semiconductor fin adjacent the substrate, wherein portions of the semiconductor fin extend beyond the isolation layer;
   a gate structure on the isolation layer and on a portion of the semiconductor fin with the gate electrode and the semiconductor fin extending in different directions; and
   a conductive layer on the isolation layer and on side surfaces of the semiconductor fin on opposite sides of the gate electrode.

2. The semiconductor device of claim 1, wherein the isolation layer is between the conductive layer and the substrate.

3. The semiconductor device of claim 1, further comprising:
   a contact pad that is in electrical contact with the conductive layer, wherein the conductive layer comprises a doped semiconductor layer and wherein the contact pad and the conductive layer comprise different materials.

4. The semiconductor device of claim 1, wherein the conductive layer comprises a contact pad.

5. The semiconductor device of claim 2 wherein the semiconductor fin includes first and second source/drain regions, and wherein the first and second source/drain regions have an n−/n+/contact pad junction structure.

6. The semiconductor device of claim 1, further comprising a first hard mask layer interposed between the semiconductor fin and the gate structure.

7. The semiconductor device of claim 4, wherein the semiconductor fin includes first and second source/drain regions, and wherein the contact pad is in direct contact with substantially all of the side surfaces of the first and second source/drain regions.

8. A semiconductor device, comprising:
   a substrate;
   a semiconductor fin extending from a surface of the substrate;
   an isolation layer on the substrate and on portions of the semiconductor fin adjacent the substrate, wherein portions of the semiconductor fin extend beyond the isolation layer;

a gate structure on the isolation layer and on a portion of the semiconductor fin with the gate electrode and the semiconductor fin extending in different directions;

a conductive layer on the isolation layer and on side surfaces of the semiconductor fin on opposite sides of the gate electrode;

a first hard mask layer on the semiconductor fin; and a first insulation interlayer on the isolation layer, wherein a top surface of the first insulation interlayer is substantially coplanar with a top surface of the first hard mask layer.

9. The semiconductor device of claim 8, wherein the gate structure comprises:

a gate insulation layer on a portion of the side surfaces of the semiconductor fin;

a first gate electrode extending from the gate insulation layer;

a second gate electrode on a top surface of the first gate electrode and on a top surface of the first hard mask layer; and a second hard mask layer on a top surface of the second gate electrode.

10. The semiconductor device of claim 3, further comprising a first insulation interlayer that is in direct contact with a first gate electrode of the gate structure and with the semiconductor layer.

11. The semiconductor device of claim 10, wherein the top surface of the first insulation interlayer is substantially coplanar with a top surface of the first gate electrode.

12. The semiconductor device of claim 9, further comprising a gate spacer on the first insulation interlayer and on a side surface of the gate structure.

13. The semiconductor device of claim 12 further comprising a second insulation interlayer on the first insulation interlayer; wherein a top surface of the second insulation interlayer is substantially coplanar with the top surface of the gate structure.

14. The semiconductor device of claim 13, wherein the gate spacer is covered by the second insulation interlayer.

15. The semiconductor device of claim 3, wherein the semiconductor layer comprises a single crystalline silicon layer, a single crystalline silicon-germanium layer or a single crystalline germanium layer, and wherein the portion of the semiconductor layer adjacent the semiconductor fin is heavily doped.

16. The semiconductor device of claim 3, wherein the contact pad comprises metal, and wherein the contact pad is on the semiconductor layer.

17. The semiconductor device of claim 16, further comprising a silicide layer interposed between the semiconductor layer and the contact pad.

18. The semiconductor device of claim 1, further comprising an etch stop layer on the top surface of the isolation layer.

19. The semiconductor device of claim 18, wherein the etch stop layer includes a vertically extending portion adjacent a source/drain region of the semiconductor fin.

20. A fin field effect transistor, comprising:

a substrate;

an active pattern comprising a first source/drain region, a channel region and a second source/drain region protruding vertically from the substrate and extending laterally in a first direction;

a first hard mask layer on a top surface of the active pattern;

a device isolation layer having a top surface which is lower than the top surface of the active pattern at least in regions adjacent the active pattern;

a gate structure on the substrate that extends laterally in a second direction that is different from the first direction, the gate structure covering the channel region of the active pattern;

a first contact pad that is in electrical contact with side surfaces of the first source/drain region; and a second contact pad that is in electrical contact with side surfaces of the second source/drain region.

21. The fin field effect transistor of claim 20, further comprising a semiconductor layer having a first portion that is in direct contact with the side surfaces of the first source/drain region and a second portion that is in direct contact with the side surfaces of the second source/drain region, wherein the first contact pad is on the first portion of the semiconductor layer and the second contact pad is on the second portion of the semiconductor layer.

22. The fin field effect transistor of claim 20, wherein the active pattern comprises an integral part of the substrate.

23. The fin field effect transistor of claim 20, wherein the first contact pad is on both top and side surfaces of the first source/drain region and the second contact pad is on both top and side surfaces of the second source/drain region.

24. A fin field effect transistor, comprising:

a substrate;

an active pattern comprising a first source/drain region, a channel region and a second source/drain region protruding vertically from the substrate and extending laterally in a first direction;

a device isolation layer having a top surface which is lower than the top surface of the active pattern at least in regions adjacent the active pattern;

a gate structure on the substrate that extends laterally in a second direction that is different from the first direction, the gate structure covering the channel region of the active pattern;

a first contact pad that is in direct contact with a top surface and with first and second side surfaces of the first source/drain region; and a second contact pad that is in direct contact with a top surface and with first and second side surfaces of the second source/drain region.

25. A semiconductor device, comprising:

a substrate;

a semiconductor fin extending from a surface of the substrate;

an isolation layer on the substrate and on portions of the semiconductor fin adjacent the substrate, wherein portions of the semiconductor fin extend beyond the isolation layer;

a gate structure on the isolation layer and on a portion of the semiconductor fin with the gate electrode and the semiconductor fin extending in different directions;

a conductive layer on the isolation layer and on side surfaces of the semiconductor fin on opposite sides of the gate electrode; and a first insulation interlayer that is in direct contact with a first gate electrode of the gate structure and with the semiconductor layer, wherein a top surface of the first insulation interlayer is substantially coplanar with a top surface of the first gate electrode.

* * * * *